United States Patent
Lee et al.

(10) Patent No.: US 12,453,117 B2
(45) Date of Patent: Oct. 21, 2025

(54) SOURCE/DRAIN REGION OF A SEMICONDUCTOR DEVICE HAVING AN OXYGEN DOPED BARRIER LAYER FORMED BETWEEN FIRST AND SECOND EPITAXIAL LAYERS

(71) Applicant: Samsung Electronics Co., Ltd., Suwon-si (KR)

(72) Inventors: Sangmoon Lee, Suwon-si (KR); Jinbum Kim, Seoul (KR); Dongsuk Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 649 days.

(21) Appl. No.: 17/709,940

(22) Filed: Mar. 31, 2022

(65) Prior Publication Data

US 2023/0065755 A1    Mar. 2, 2023

(30) Foreign Application Priority Data

Aug. 27, 2021    (KR) .......................... 10-2021-0113698

(51) Int. Cl.
*H01L 29/417* (2006.01)
*H10D 30/62* (2025.01)
*H10D 62/815* (2025.01)

(52) U.S. Cl.
CPC ..... *H10D 30/6219* (2025.01); *H10D 30/6211* (2025.01); *H10D 62/8164* (2025.01)

(58) Field of Classification Search
CPC .................... H01L 29/42392; H01L 29/78696
See application file for complete search history.

(56) References Cited

U.S. PATENT DOCUMENTS

| 9,608,117 B2 | 3/2017 | Kim et al. |
| 10,008,600 B2 | 6/2018 | Kim et al. |
| 10,026,838 B2 | 7/2018 | Wu et al. |

(Continued)

FOREIGN PATENT DOCUMENTS

| KR | 10-2008-0061698 A | 7/2008 |
| KR | 10-2020-0007452 A | 1/2020 |

(Continued)

OTHER PUBLICATIONS

Kim, et al., "In situ Implementation of Silicon Epitaxial Layer on Amorphous SiO2 using Reduced-Pressure Chemical Vapor Deposition", Applied Materials Today, 24 (2021) 101143; https://doi.org/10.1016/j.apmt.2021.101143, pp. 1-7.

(Continued)

*Primary Examiner* — Anh D Mai
(74) *Attorney, Agent, or Firm* — Wolf, Greenfield & Sacks, P.C.

(57) ABSTRACT

A semiconductor device includes: an active region extending on a substrate in a first direction; a gate structure intersecting the active region and extending on the substrate in a second direction; and a source/drain region on the active region on at least one side of the gate structure. The source/drain region may include a first epitaxial layer on the active region and including impurities of a first conductivity type in a first concentration, a second epitaxial layer on the first epitaxial layer and including the impurities of the first conductivity type in a second concentration, and a first barrier layer between the first epitaxial layer and the second epitaxial layer, wherein the first barrier layer includes doped oxygen.

20 Claims, 32 Drawing Sheets

(56) References Cited

U.S. PATENT DOCUMENTS

| | | |
|---|---|---|
| 10,079,305 B2 | 9/2018 | Lee et al. |
| 10,586,852 B2 | 3/2020 | Lee et al. |
| 10,868,175 B2 | 12/2020 | Kuang et al. |
| 10,991,826 B2 | 4/2021 | Ma et al. |
| 2013/0062670 A1 | 3/2013 | Wong et al. |
| 2019/0296144 A1 | 9/2019 | Jung et al. |
| 2020/0168723 A1 | 5/2020 | Hsu et al. |

FOREIGN PATENT DOCUMENTS

| | | |
|---|---|---|
| KR | 10-2020-0086607 A | 7/2020 |
| KR | 10-2020-0135684 A | 12/2020 |

OTHER PUBLICATIONS

P.V. Schwartz, et al., "Semi-Insulating Crystalline Silicon Formed by Oxygen Doping During Low-Temperature Chemical Vapor Deposition", Applied Physics Letter 62 (10), Mar. 8, 1993, pp. 1102-1104.

W. Kaiser, et al., "Oxygen Content of Silicon Single Crystals", Journal of Applied Physics, vol. 28, No. 8; Aug. 1957, pp. 882-887.

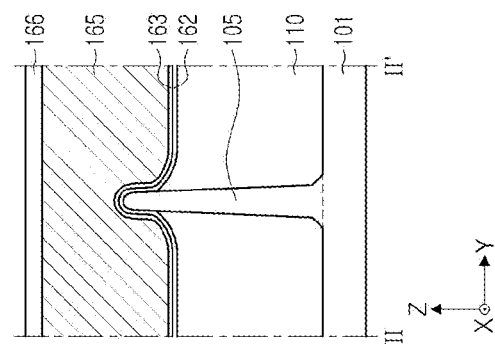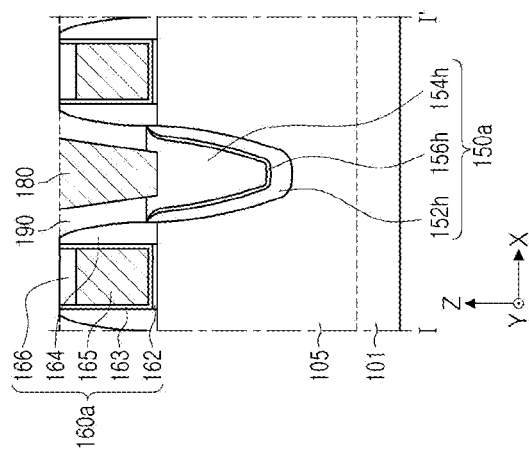
FIG. 14

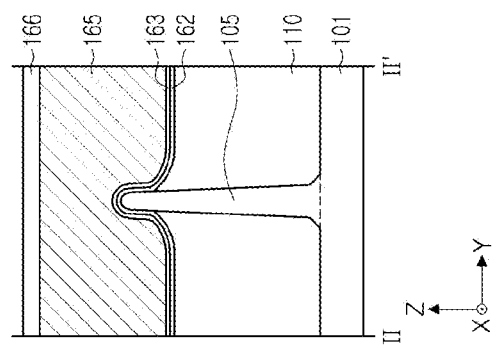
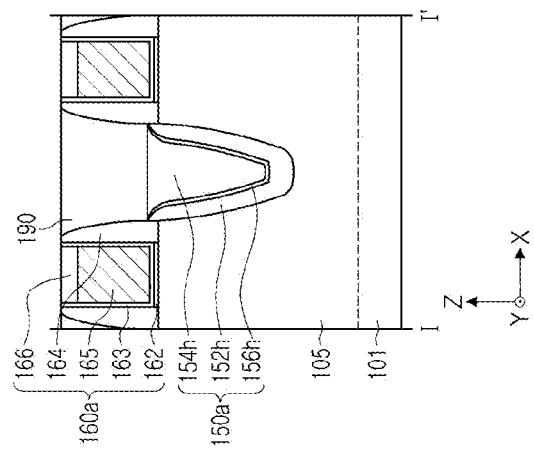
FIG. 15G

SOURCE/DRAIN REGION OF A SEMICONDUCTOR DEVICE HAVING AN OXYGEN DOPED BARRIER LAYER FORMED BETWEEN FIRST AND SECOND EPITAXIAL LAYERS

CROSS-REFERENCE TO RELATED APPLICATION(S)

This application claims benefit of priority to Korean Patent Application No. 10-2021-0113698 filed on Aug. 27, 2021, in the Korean Intellectual Property Office, the disclosure of which is incorporated herein by reference in its entirety.

BACKGROUND

Example embodiments of the present disclosure relate to a semiconductor device.

As demand for high performance, high speed, and/or multifunctionality in a semiconductor device have increased, integration density of a semiconductor device has increased. In manufacturing a semiconductor device having a fine pattern corresponding to the trend of high integration density of a semiconductor device, there has been an effort to implement patterns having a fine width or a fine spacing. Also, to overcome the limitations of operation properties due to the reduction of a size of a planar metal oxide semiconductor FET (MOSFET), there have been attempts to develop a semiconductor device including a Fin Field Effect Transistor (FinFET) having a three-dimensional channel structure.

SUMMARY

An example embodiment of the present disclosure is to provide a semiconductor device having improved electrical properties.

According to an example embodiment of the present disclosure, a semiconductor device includes: an active region extending on a substrate in a first direction; a gate structure intersecting the active region and extending on the substrate in a second direction; and a source/drain region on the active region on at least one side of the gate structure, wherein the source/drain region comprises: a first epitaxial layer on the active region comprising impurities of a first conductivity type in a first concentration; a second epitaxial layer on the first epitaxial layer comprising impurities of the first conductivity type in a second concentration; and a first barrier layer between the first epitaxial layer and the second epitaxial layer, wherein the first barrier layer comprises doped oxygen.

According to another example embodiment of the present disclosure, a semiconductor device includes: an active region extending on a substrate in a first direction; a gate structure intersecting the active region and extending on the substrate in a second direction; and a source/drain region on the active region on at least one side of the gate structure, wherein the source/drain region comprises a first epitaxial layer and a second epitaxial layer stacked on the active region, and an oxygen-doped barrier layer adjacent to at least one of the first epitaxial layer and the second epitaxial layer.

BRIEF DESCRIPTION OF DRAWINGS

The above and other aspects, features, and advantages of the present disclosure will be more clearly understood from the following detailed description, taken in conjunction with the accompanying drawings, in which:

FIG. 14 is a cross-sectional view illustrating a semiconductor device according to example embodiments of the present disclosure; and FIGS. 15A to 15G are views illustrating processes of an example method of manufacturing a semiconductor device according to example embodiments of the present disclosure.

DETAILED DESCRIPTION

Hereinafter, embodiments of the present disclosure will be described as follows with reference to the accompanying drawings.

Figure 1:
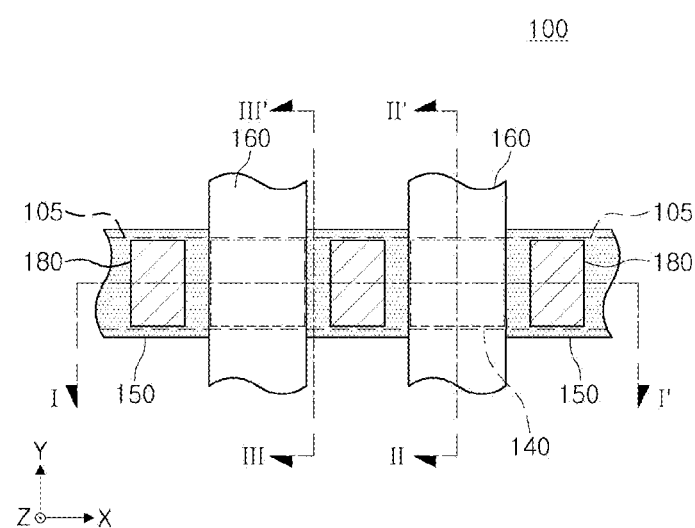
FIG. 1 is a plan view illustrating a semiconductor device according to example embodiments of the present disclosure.

FIG. 1 is a plan view illustrating a semiconductor device according to example embodiments.

Figure 2:
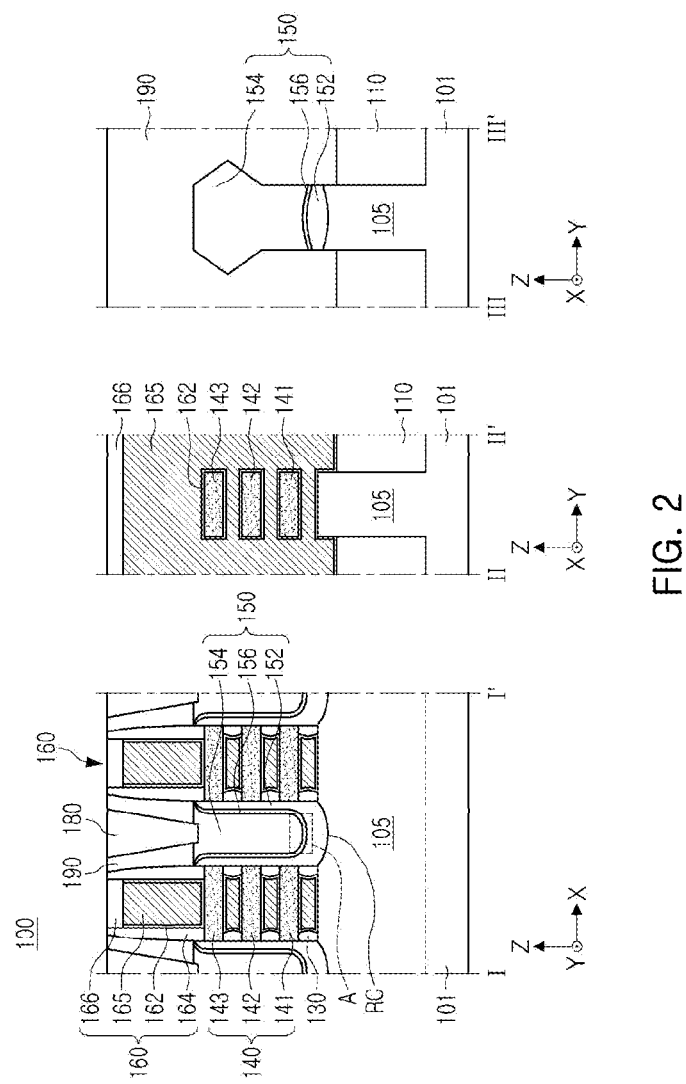
FIG. 2 is a cross-sectional view illustrating a semiconductor device according to example embodiments of the present disclosure.

FIG. 2 is a cross-sectional view illustrating a semiconductor device according to example embodiments, taken long lines in FIG. 1. FIGS. 1 and 2 only illustrate main components of the semiconductor device for ease of description.

Referring to FIGS. 1 and 2, the semiconductor device 100 may include: a substrate 101; an active region 105 on the substrate 101; one or more channel structures 140, each including a plurality of channel layers 141, 142, and 143 on the active region 105 and spaced apart from each other in the X-direction; a plurality of source/drain regions 150 in contact with the plurality of channel layers 141, 142, and 143; a plurality of gate structures 160 extending on the substrate 101 and intersecting the active region 105; and contact plugs 180 connected to respective ones of the plurality of source/drain regions 150. In one embodiment, the one or more channel structures 140 may extend vertically (i.e., in the Z-direction). The semiconductor device 100 may further include device isolation layers 110, internal spacer layers 130, and an interlayer insulating layer 190. The gate structure 160 may also include a gate dielectric layer 162, a gate electrode 165, spacer layers 164, and a gate capping layer 166.

In one embodiment of the semiconductor device 100, the active region 105 may have a fin structure, and the gate electrode 165 may be disposed between the active region 105 and the channel structure 140 and between the plurality of channel layers 141, 142, and 143 of the channel structures 140. Accordingly, the semiconductor device 100 may include a multi-bridge channel FET (MBCFET™), a gateall-around type field effect transistor formed by the channel structures 140, the source/drain regions 150 and the gate structures 160. The transistor may be, for example, a NMOS (N-yype metal-oxide-semiconductor) transistor. The transistor may be, for example, a PMOS (P-type metal-oxide-semiconductor) transistor.

The substrate 101 may have an upper surface extending in the X-direction and the Y-direction. The substrate 101 may include a semiconductor material, such as, for example, a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as a bulk wafer, an epitaxial layer, a silicon on insulator (SOI) layer, or a semiconductor on insulator (SeOI) layer.

The device isolation layer 110 may define the active region 105 on the substrate 101. The device isolation layer 110 may be formed by, for example, a shallow trench isolation (STI) process. In example embodiments, the device isolation layer 110 may include a region extending further to a region below a top surface of the substrate 101. The device isolation layer 110 may have a curved upper surface having a higher level toward the active region 105, but the shape of the upper surface of the device isolation layer 110 is not limited thereto. The device isolation layer 110 may be formed of an insulating material. The device isolation layer 110 may be, for example, an oxide, a nitride, or a combination thereof.

The active region 105 may be defined by the device isolation layer 110 in the substrate 101, and may extend in a first direction, such as, for example, an X-direction. The active region 105 may have a structure protruding from the substrate 101. An upper end of the active region 105 may protrude from the upper surface of the device isolation layer 110 by a predetermined height. The active region 105 may be formed as a portion of the substrate 101, or may include an epitaxial layer grown from the substrate 101. However, the active region 105 on the substrate 101 may be partially recessed on both sides of the gate structures 160, and the source/drain regions 150 may be disposed on the recessed active region 105.

The channel structure 140 may include first to third channel layers 141, 142, and 143, with two or more of the channel layers in a direction perpendicular to the upper surface of the active region 105, that is, for example, in the Z-direction. The first to third channel layers 141, 142, and 143 may be connected to the source/drain region 150 and may be spaced apart from the upper surface of the active region 105. The first to third channel layers 141, 142, and 143 may have a width the same as, or similar to, that of the active region 105 in the Y-direction, and may have a width the same as, or similar to, that of the gate structure 160 in the X-direction. However, in example embodiments, the first to third channel layers 141, 142, and 143 may have a reduced width such that side surfaces thereof may be disposed below the gate structure 160 in the X-direction. As used herein, the term "Element A is below Element B" refers to at least a portion of the Element A being closer to a top surface of the substrate than at least a portion of Element B. In some embodiments, "below" would be closer to a top surface of the substrate in the Z-direction.

The first to third channel layers 141, 142, and 143 may be formed of a semiconductor material, such as, for example, at least one of silicon (Si), silicon germanium (SiGe), and germanium (Ge). The first to third channel layers 141, 142, and 143 may be formed of the same material as that of the substrate 101, for example. The number and the shape of the channel layers 141, 142, and 143 included in a single channel structure 140 may be varied in example embodiments. For example, a channel layer may be further disposed in a region in which the active region 105 is in contact with the gate electrode 165 in example embodiments.

The plurality of source/drain regions 150 may be disposed on the active region 105 on both sides of the channel structure 140. Each source/drain region 150 may include a first epitaxial layer 152 disposed along a side surface of each of the first to third channel layers 141, 142, and 143 of the channel structure 140, and a second epitaxial layer 154 on the first epitaxial layer 152. In some embodiments, each of the source/drain regions 150 may further include a barrier layer 156 between the first epitaxial layer 152 and the second epitaxial layer 154. Both the first epitaxial layer 152 and the second epitaxial layer 154 may be semiconductor layers including silicon (Si), and may include impurities of different types and/or concentrations.

According to an example, impurities doped into the first epitaxial layer 152 and the second epitaxial layer 154 may be impurities of the same conductivity type. For example, the first epitaxial layer 152 may include one of arsenic (As), phosphorus (P), antimony (Sb), boron (B), gallium (Ga), and aluminum (Al), and may be a SiAs layer, a SiP layer, or a SiGe:P layer or a SiGe:B layer. The first epitaxial layers 152 may be on the recessed active region. The second epitaxial layer 154 may be a region including impurities in a concentration higher than that in the first epitaxial layer 152. The second epitaxial layer 154 may be epitaxially grown on the first epitaxial layer 152. The impurities doped in the second epitaxial layer 154 may be the same as or different from the impurities doped in the first epitaxial layer 152. For example, the second epitaxial layer 154 may be a SiP layer including phosphorus (P). In an example embodiment, the first epitaxial layer 152 may be a SiAs epitaxial layer, and the second epitaxial layer 154 may be a SiP epitaxial layer.

The barrier layer 156 may be provided by being epitaxially-grown between the first epitaxial layer 152 and the second epitaxial layer 154. The barrier layer 156 may be doped with oxygen (O-doped). The concentration of oxygen doped in the barrier layer 156 may be in a range of $1 \times 10^{19}$ atoms/cm$^3$ to $1 \times 10^{21}$ atoms/cm$^3$. The barrier layer 156 may have a superlattice structure. As used herein, a superlattice structure may refer to a structure in which a plurality of material layers having differentiated properties may have a thin thickness (i.e, each of the plurality of material layers is thin) and may be alternately stacked. In some embodiments, each of the plurality of material layers may be in the range of about 0.1 nanometers (nm) to about 1.0 nm, although the present disclosure is not limited to these thicknesses. According to another example, the barrier layer 156 may be provided as a single layer. A detailed description thereof will be described below with reference to FIGS. 3A and 3B.

According to an example, a thickness of the barrier layer 156 may be configured to be five (5) nanometers (nm) or less. According to an example, the thickness t2 of the barrier layer 156 may be smaller than the thickness of each of the first epitaxial layer 152 and the second epitaxial layer 154. According to an example, the barrier layer 156 may be one of an O-doped SiP layer, an O-doped SiAs layer, an O-doped SiGe layer, and an O-doped Si layer. In an example embodiment, diffusion of impurities included in the source/drain region 150 may be prevented through the barrier layer 156 in which a semiconductor material is doped with oxygen. According to an example, the barrier layer 156 may be disposed between the first epitaxial layer 152 and the second epitaxial layer 154, and may prevent diffusion of impurities from the second epitaxial layer 154 having a higher doping concentration to the first epitaxial layer 154 and the channel layers 141, 142, and 143. In the example embodiments in the drawings described below, the position in which the barrier layer 156 is formed may be varied.

According to an example, when the semiconductor device 100 in FIG. 2 is a PMOS, a Ge element concentration in the second epitaxial layer 154 may be higher than a Ge element concentration in the first epitaxial layer 152. The second epitaxial layer 154 having a higher Ge element concentration than that of the first epitaxial layer 152 may be a stressor applying compressive stress to the channel region. In the example embodiment, by disposing the barrier layer 156 containing oxygen between the first epitaxial layer 152 and the second epitaxial layer 154, charge mobility in the channel region may increase, and diffusion of impurities into the channel layers 141, 142, and 143 may also be prevented.

The gate structure 160 may intersect the active region 105 and one or more of the channel structures 140 above the active region 105 and the channel structures 140, and may extend in one direction, such as, for example, the Y-direction. Channel regions of the transistors may be formed in the active region 105 and the channel structures 140 intersecting the gate structure 160. The gate structure 160 may include: a gate electrode 165; a gate dielectric layer 162 between the gate electrode 165 and the plurality of channel layers 141, 142, and 143; one or more spacer layers 164 on side surfaces of the gate electrode 165, and a gate capping layer 166 on an upper surface of the gate electrode 165.

The gate dielectric layer 162 may be between the active region 105 and the gate electrode 165 and between the channel structure 140 and the gate electrode 165, and may at least partially cover at least a portion of the surfaces of the gate electrode 165. For example, the gate dielectric layer 162 may surround entire surfaces of the gate electrode 165 other than an uppermost surface. It will be understood that "an element A surrounds an element B" (or similar language) as used herein means that the element A is at least partially around the element B but does not necessarily mean that the element A completely encloses the element B. The gate dielectric layer 162 may extend to a region between the gate electrode 165 and the spacer layers 164, but an example embodiment thereof is not limited thereto. The gate dielectric layer 162 may include an oxide, nitride, or a high-k material. A high-k material may refer to a dielectric material having a dielectric constant higher than that of a silicon oxide layer ($SiO_2$).

The gate electrode 165 may be disposed on the active region 105, and may fill at least a portion of a region between the plurality of channel layers 141, 142, and 143 and may extend to a region above the channel structure 140. The gate electrode 165 may be spaced apart from the plurality of channel layers 141, 142, and 143 by the gate dielectric layer 162. The gate electrode 165 may include a conductive material, such as, for example, a metal nitride such as a titanium nitride film (TiN), a tantalum nitride film (TaN), or a tungsten nitride film (WN), and/or a metal material such as aluminum (Al), tungsten. (W), or molybdenum (Mo), or a semiconductor material such as doped polysilicon. The gate electrode 165 may include multiple layers, that is, two or more layers. Depending on the configuration of the semiconductor device 100, the gate electrodes 165 may be separated from each other between at least a portion of the transistors adjacent to each other by a separator.

Gate spacer layers 164 may be on both sides of the gate electrode 165. The gate spacer layers 164 may insulate the source/drain regions 150 from the gate electrodes 165. The gate spacer layers 164 may have a multilayer structure in example embodiments. The gate spacer layers 164 may be formed of oxide, nitride, or oxynitride, and may be formed of a low-k film, for example. A low-k material may refer to a dielectric material having a dielectric constant lower than that of a silicon oxide layer ($SiO_2$).

The gate capping layer 166 may be on the gate electrode 165, and a lower surface and side surfaces of the gate capping layer 166 may be surrounded by the gate electrode 165 and the gate spacer layers 164, respectively.

Internal spacer layers 130 may be disposed in parallel with the gate electrode 165 between the channel structures 140. The gate electrode 165 may be spaced apart from and electrically separated from the source/drain regions 150 by the internal spacer layers 130 below the third channel layer 143. The internal spacer layers 130 may have a shape in which a side surface thereof opposing the gate electrode 165 may be inwardly rounded toward the gate electrode 165, but an example embodiment thereof is not limited thereto. The internal spacer layers 130 may be formed of oxide, nitride, and oxynitride, and may be formed of a low-k film, for example.

The interlayer insulating layer 190 may be on, and at partially cover, the source/drain regions 150 and the gate structures 160, and may be on, and at least partially cover, the device isolation layer 110 in a region not illustrated. The interlayer insulating layer 190 may include, for example, at least one of an oxide, a nitride, and an oxynitride, and may include a low-k material.

A contact plug 180 may penetrate the interlayer insulating layer 190 and may extend vertically (i.e., in the Z-direction) from an upper portion to a lower portion. The contact plug 180 may extend further downwardly than the third channel layer 143, for example. The contact plug 180 may be recessed up to, for example, the upper surface of the second channel layer 142, but an example embodiment thereof is not limited thereto. In example embodiments, the contact plug 180 may not be recessed into the source/drain region 150 and may be in contact with the source/drain region 150 along the upper surface of the source/drain region 150.

Figure 3A:
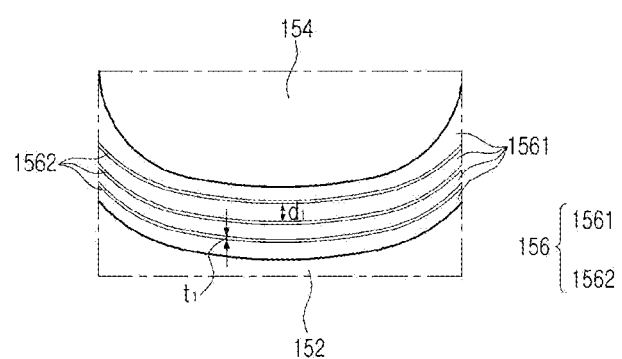
FIGS. 3A and 3B are enlarged cross-sectional views illustrating a portion A of the semiconductor device illustrated in FIG. 2 according to example embodiments of the present disclosure.
Figure 3B:
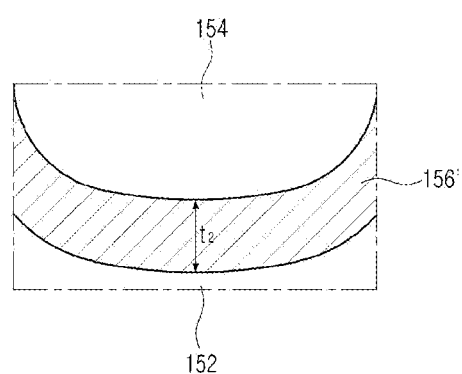

FIGS. 3A and 3B are enlarged cross-sectional views illustrating a portion of a semiconductor device according to example embodiments, illustrating a region corresponding to region "A" in FIG. 2.

Referring to FIG. 3A, the barrier layer 156 disposed between the first epitaxial layer 152 and the second epitaxial layer 154 may be provided in a superlattice structure. The superlattice structure may refer to a structure in which a plurality of material layers having differentiated properties may have a thin thickness (i.e, each of the plurality of material layers is thin) and may be alternately stacked. In some embodiments, each of the plurality of material layers may be in the range of about 0.1 nanometers (nm) to about 1.0 nm, although the present disclosure is not limited to these thicknesses. The barrier layer 156 may be provided by alternately stacking a first material layer 1561 and a second material layer 1562. According to an example, the first material layer 1561 may include a pure semiconductor material undoped with impurities. According to an example, the first material layer 1561 may be one of silicon (Si), silicon germanium (SiGe), and germanium (Ge). The second material layer 1562 may be a material layer including oxygen. According to an example, the second material layer 1562 may be an oxygen-doped layer formed through an $O_2$ gas. According to an example, each of the second material layers 1562 disposed between the plurality of first material layers 1561 may be provided by combining two to three layers including oxygen. The two to three layers including oxygen of the second material layers 1562 may have a thickness of 0.1 nanometers (nm) to one (1) nm.

FIG. 3A illustrates an example in which a superlattice structure of the barrier layer 156 may be provided by alternately stacking four first material layers 1561 and three second material layers 1562. According to an example in FIG. 3A, the superlattice structure may include three oxygen-doped layers 1562. However, the number of material layers 1561 and the number of oxygen-doped layers 1562 is not limited thereto, and an appropriate number of oxygen-doped layers 1562 may be five or any other appropriate number. A distance d1 between the oxygen doped layers 1562 may be 1 nm to 1.5 nm. Differently from the example in which the barrier layer 156' is provided as a single layer as illustrated in FIG. 3B, when the barrier layer 156 is provided in a superlattice structure as illustrated in FIG. 3A, a thickness t1 of each of the oxygen doped layers 1562 may be significantly reduced. According to an example, the thickness t1 of each of the oxygen doped layers may be 0.1 nm or more and 1 nm or less.

According to another example in FIG. 3A, the barrier layer 156 may include a first material layer 1561 and a second material layer 1562 alternately stacked. The first material layer 1561 may include the same material as those included in the first epitaxial layer 152 and the second epitaxial layer 154. The first material layer 1561 may be doped in a doping concentration different from that of impurities doped in the first epitaxial layer 152 and the second epitaxial layer 154. According to an example, it may be assumed that the first epitaxial layer 152 may be SiP, P may be doped in a first concentration, the second epitaxial layer 154 may be SiP, and P may be doped in a second concentration. In this case, the first material layer 1561 may be SiP, and may be a material doped with P in a concentration in a lower range than the second concentration. According to an example, the concentration of the impurity doped into the first material layer 1561 may be higher than the first concentration and may be lower than the second concentration.

According to another example, it may be assumed that the first epitaxial layer 152 may be SiP and may be doped with impurities in a first concentration, and the second epitaxial layer 154 may be SiAs, and may be doped with impurities in a second concentration. In this case, the first material layer 1561 may be SiAs and may include a material doped with impurities in a concentration in a range lower than the second concentration. Alternatively, the first material layer 1561 may be SiP and may include a material doped with impurities in a concentration in a range lower than the second concentration. The second material layer 1562 may be a material including oxygen. According to an example, the second material layer 1562 may be an oxygen-doped layer formed through O$_2$ gas. According to an example, each of the second material layers 1562 disposed between the plurality of first material layers 1561 may be provided by combining two to three layers including oxygen.

According to FIG. 3B, differently from FIG. 3A, a barrier layer 156' may be provided as a single layer which may be epitaxially grown. The barrier layer 156' may be configured to have a constant thickness t2. The thickness t2 of the barrier layer 156' may be 0.1 nm to 5 nm or less. According to an example, the barrier layer 156' in FIG. 3B may be at least one of O-doped SiP, O-doped SiAs, O-doped SiGe, and O-doped Si.

In the example embodiments in FIGS. 5 to 12 below, it may be assumed that the barrier layer 156 is provided as a single layer, but in the example embodiments in FIGS. 5 to 12, the barrier layer 156 may be provided in a superlattice structure.

Figure 4:
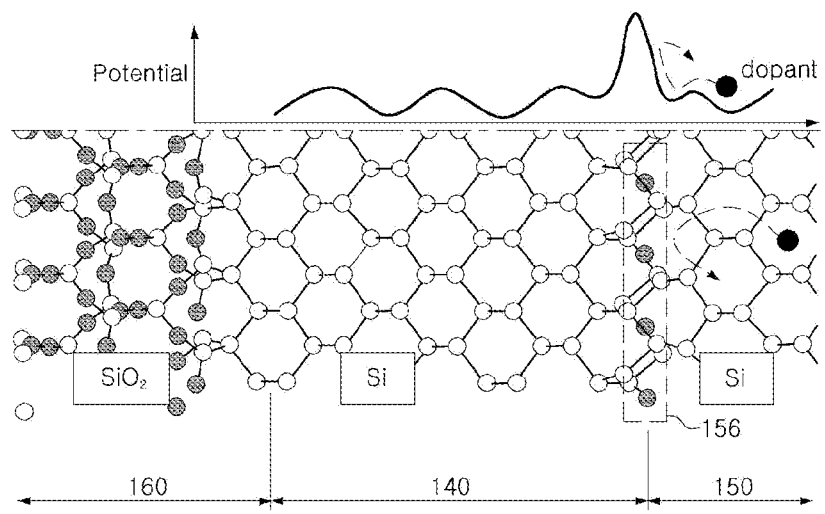
FIG. 4 is a view illustrating a principle of a semiconductor device according to example embodiments of the present disclosure.

FIG. 4 is a view illustrating a principle of a semiconductor device according to example embodiments. FIG. 4 illustrates an example in which a semiconductor device includes an NMOS.

FIG. 4 illustrates an atomic bonding structure corresponding to each of the gate structure 160, the channel structure 140, and the source/drain region 150. FIG. 4 is a view illustrating a three-dimensional atomic bonding structure. According to an example, the gate structure 160 may include SiO$_2$. The gate structure 160 adjacent to the channel structure 140 may be the gate dielectric layer 162 (see FIG. 2). Referring to FIG. 4, Si is illustrated as white atoms, O as gray atoms, and impurities (dopants) are illustrated as black atoms. Due to the bonding structure of SiO$_2$ included in the gate dielectric layer 162, electrons as carriers may not pass through the gate dielectric layer 162.

FIG. 4 illustrates a structure in which the barrier layer 156 doped with oxygen is formed between the channel structure 140 and the source/drain regions 150. In FIG. 4 the barrier layer 156 is marked gray between the channel structure 140 and the source/drain regions 150. When the barrier layer 156 doped with oxygen is formed between the channel structure 140 and the source/drain region 150, diffusion of impurities may be prevented by blocking a path through which impurities doped into the source/drain region 150 are diffused. Referring to FIG. 4, the barrier layer 156 may be formed to prevent only diffusion of impurities and to allow electrons to pass through, such that performance may improve without affecting electrical properties of the semiconductor device.

The horizontal axis of the graph in FIG. 4 may correspond to each of the gate structure 160, the channel structure 140, and the source/drain region 150, and the vertical axis of the graph in FIG. 4 may indicate potential energy. Referring to the graph in FIG. 4, the potential energy may increase in the position in which the barrier layer 156 doped with oxygen is disposed, such that, to pass through the layer, high energy may be necessary. Accordingly, it may be indicated that diffusion of impurities may be prevented.

According to a general semiconductor device, when a contacted poly pitch (CPP) is reduced to increase integration density, impurities doped in the source/drain region 150 may be diffused into the channel such that the short channel effect of a channel having a relatively short gate length may greatly increase, and properties may greatly degrade. To address the above issue, a method of inserting the barrier layer 156 doped with oxygen to a region between the source/drain region 150 and the channel structure 140 may be used in an example embodiment.

Examples in which the performance of the barrier layer 156 doped with oxygen in the example embodiment is tested will be described, describing the cases of an NMOS and a PMOS.

In the case of NMOS, annealing was performed on a sample in which Si was grown on the SiP layer, O-doped Si by an in-situ method on the SiP layer, and O-doped Si by an ex-situ method on the SiP layer at 1050° C. for 20 seconds. The degree of diffusion of P into the Si surface was tested, and the analysis was carried out by SIMS (Secondary-ion mass spectrometry). As a result, O-doped Si doped by an in-situ method, and SiP and O-doped Si doped by an ex-situ method diffused by 5.0 nm/dec (nanometer/decimeter), while Si and SiP not O-doped diffused by 21.5 nm/dec. Accordingly, it is indicated that the O-doped layer may prevent diffusion of impurities in the NMOS.

In the case of PMOS, annealing was performed on each of the sample in which Si was grown on the SiGeB layer and the sample in which O-doped Si was grown on the SiGeB layer at 1050° C. for 20 seconds, the degree of diffusion of B into the Si surface was tested and the analysis was carried out by SIMS. As a result, SiGeB and O-doped Si diffused by 8.4 nm/dec, and Si and SiGeB not O-doped diffused by 13.0 nm/dec. Accordingly, it is indicated that the O-doped layer may prevent diffusion of impurities in the PMOS.

FIGS. 5 to 12 are cross-sectional views illustrating a portion of a semiconductor device according to example embodiments.

In the example embodiment in FIGS. 5 to 12, the same reference numerals as in FIG. 2 above indicate a corresponding component, and the overlapping description will not be provided. In the example embodiment in FIGS. 5 to 12, the same reference numeral but the different alphabet may be used to describe a different example embodiment, and the descriptions of the elements having the same reference numeral may be the same.

Figure 5:
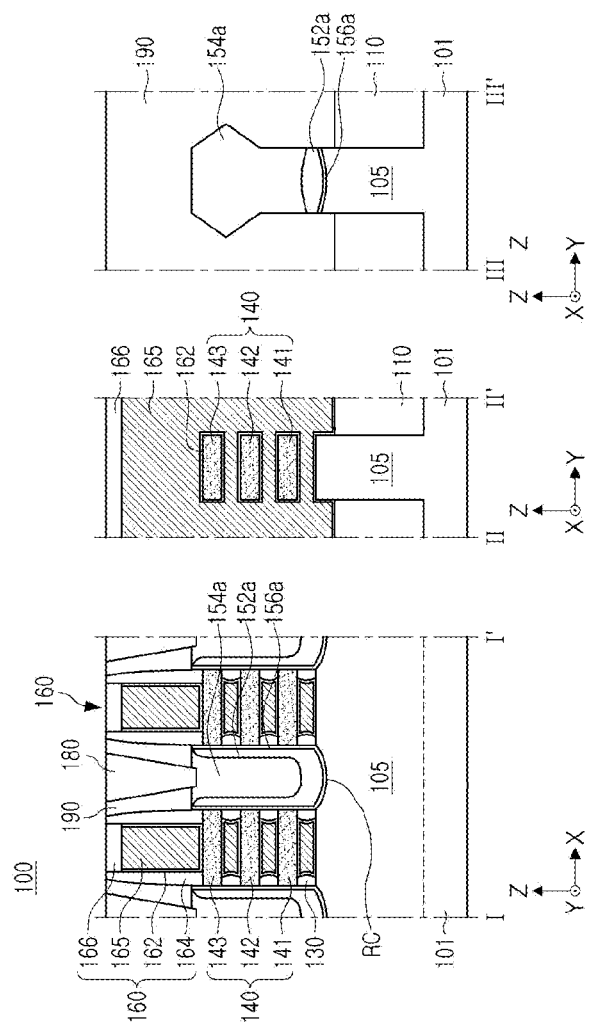
FIGS. 5 to 12 are cross-sectional views illustrating a semiconductor device according to example embodiments of the present disclosure.

Referring to FIG. 5, the barrier layer 156a of the semiconductor device 100 may be disposed below the first epitaxial layer 152a. The barrier layer 156a may be disposed below the first epitaxial layer 152a to prevent diffusion of impurities in the first epitaxial layer 152a and the second epitaxial layer 154a. The barrier layer 156a in FIG. 5 may be disposed above the recess region RC and below the first epitaxial layer 152a. The barrier layer 156a may be provided in a superlattice structure.

Figure 6:
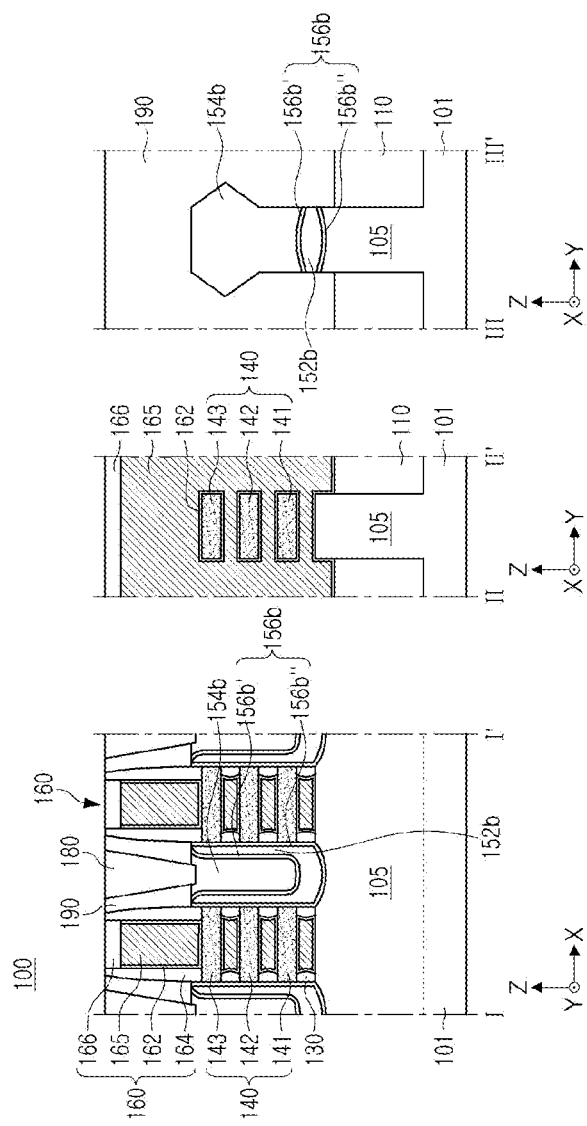

Referring to FIG. 6, the barrier layer 156b of the semiconductor device 100 may be provided to at least partially surround the first epitaxial layer 152b. In some embodiments, the barrier layer 156b may completely surround the first epitaxial layer 152b. Referring to FIG. 6, the barrier layer 156b of the semiconductor device 100 may include a first barrier layer 156b' and a second barrier layer 156b". Referring to FIG. 6, a first barrier layer 156b' may be disposed on the first epitaxial layer 152b of the semiconductor device 100, and a second barrier layer 156b" may be disposed below the first epitaxial layer 152. The first barrier layer 156b' and the second barrier layer 156b" may be combined with each other and may at least partially surround the first epitaxial layer 152b, or in some embodiments, may completely surround the first epitaxial layer 152b. The thicknesses of the first barrier layer 156b' and the second barrier layer 156b" may be the same or different. According to an example, the thickness of the second barrier layer 156b" may be greater than the thickness of the first barrier layer 156b'.

Figure 7:
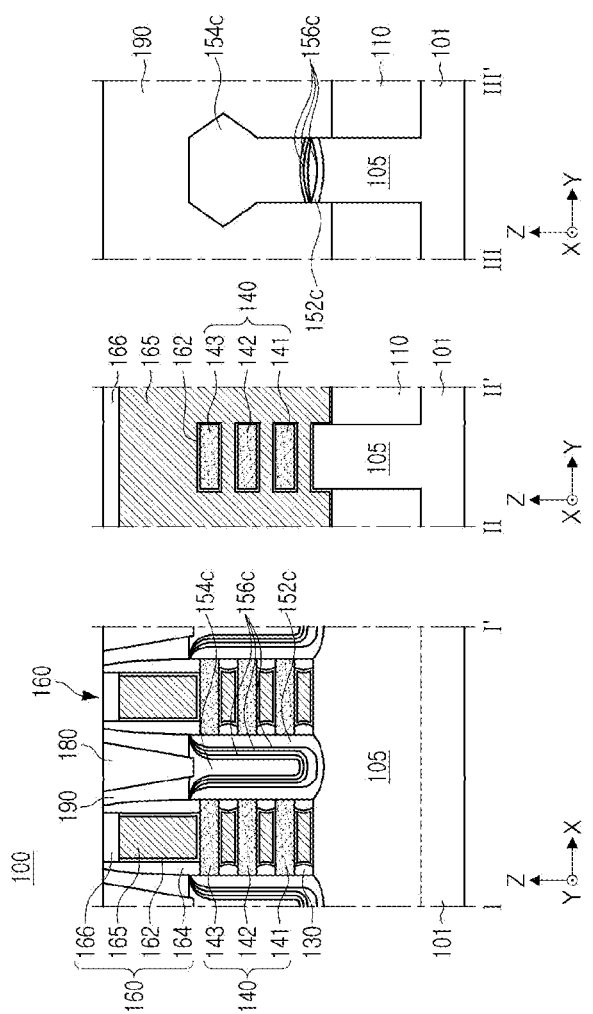

Referring to FIG. 7, the barrier layer 156c of the semiconductor device may be formed in a superlattice structure in the first epitaxial layer 152c. The example embodiment in FIG. 7 may be compared to the example embodiment in FIG. 2 as below. According to the example embodiment in FIG. 2, the barrier layer 156 may be disposed between the first epitaxial layer 152 and the second epitaxial layer 154. In this case, the barrier layer 156 may be provided as a single layer or in a superlattice structure. In the example embodiment in FIG. 2, when the barrier layer 156 is provided in a superlattice structure, a material different from the material forming the first epitaxial layer 152 and the second epitaxial layer 154 may be used as a material of the first material layer to form a superlattice structure.

According to the example embodiment in FIG. 7, differently from the above-described example, the barrier layer 156c may be formed together when the first epitaxial layer 152c is formed and the barrier layer 156c may form a superlattice structure with the first epitaxial layer 152c. According to an example, by stacking the first material layer and the second material layer in order (i.e., sequentially) using the first epitaxial layer 152c as the first material layer and the material containing oxygen as the second material layer, the oxygen-doped barrier layer 156c may be included in the first epitaxial layer 152c.

Figure 8:
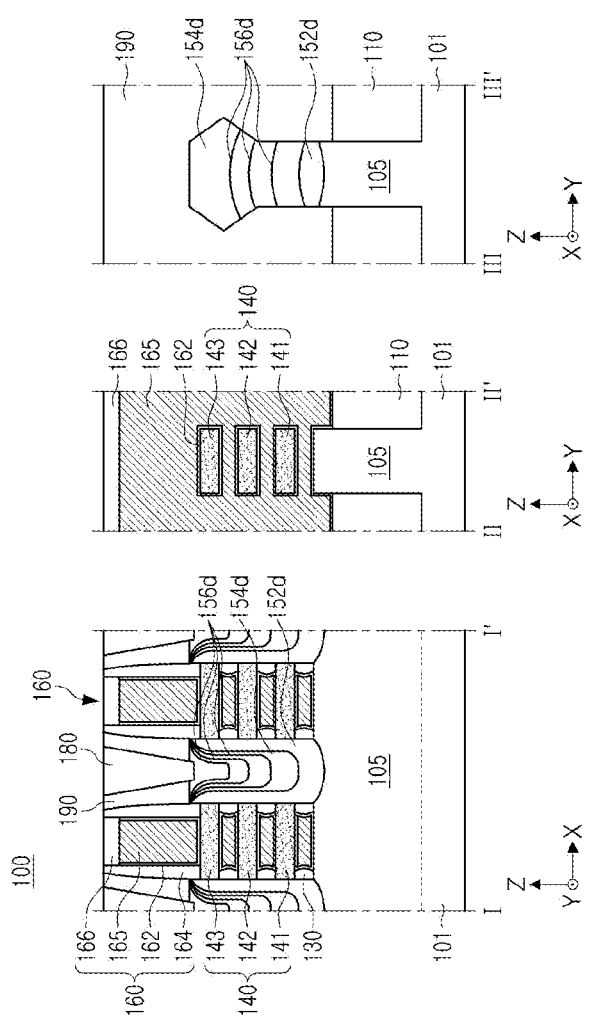

According to the example embodiment in FIG. 8, the barrier layer 156d may be formed in a superlattice structure in the second epitaxial layer 154d. The barrier layer 156d may be formed together when the second epitaxial layer 154d is formed and the barrier layer 156d may form a superlattice structure. According to an example, by stacking the second epitaxial layer 154d as the first material layer and a material including oxygen as the second material layer, the barrier layer 156d may be included in the second epitaxial layer 154d. In the example embodiment in FIGS. 7 to 8, when one of the first epitaxial layer 152c or the second epitaxial layer 154d is formed, the layers may be formed by stacking the barrier layers 156c and 156d. Accordingly, the thicknesses of the first epitaxial layer 152c or the second epitaxial layer 154d may be secured, which may be efficient to improve performance. Referring to FIGS. 7 and 8, the oxygen-doped barrier layer 156c may be adjacent the first epitaxial layer 152c, adjacent the second epitaxial layer 154d, or adjacent both the first epitaxial layer 152c and the second epitaxial layer 154d.

Figure 9:
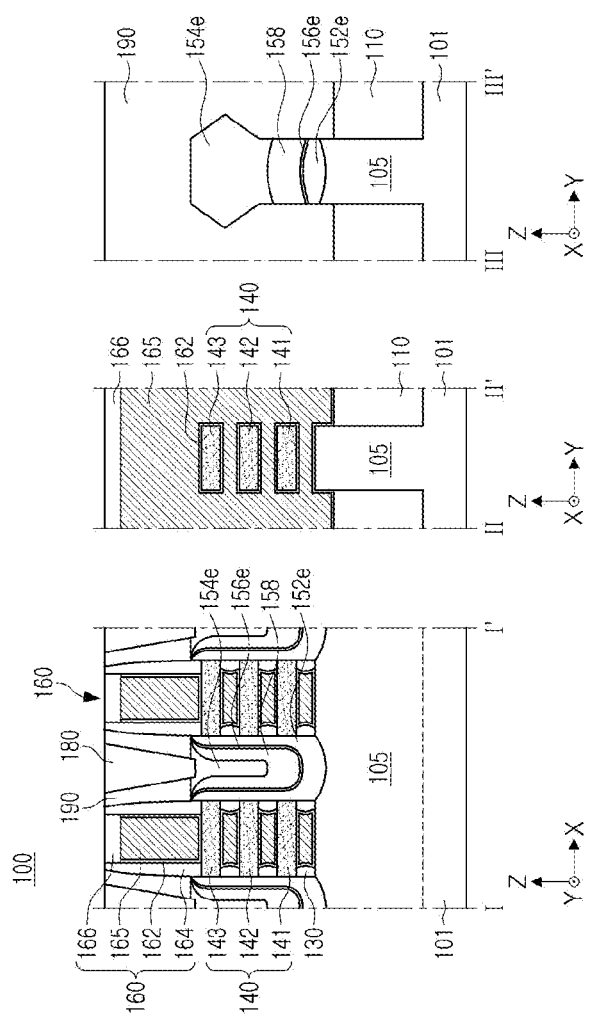
Figure 10:
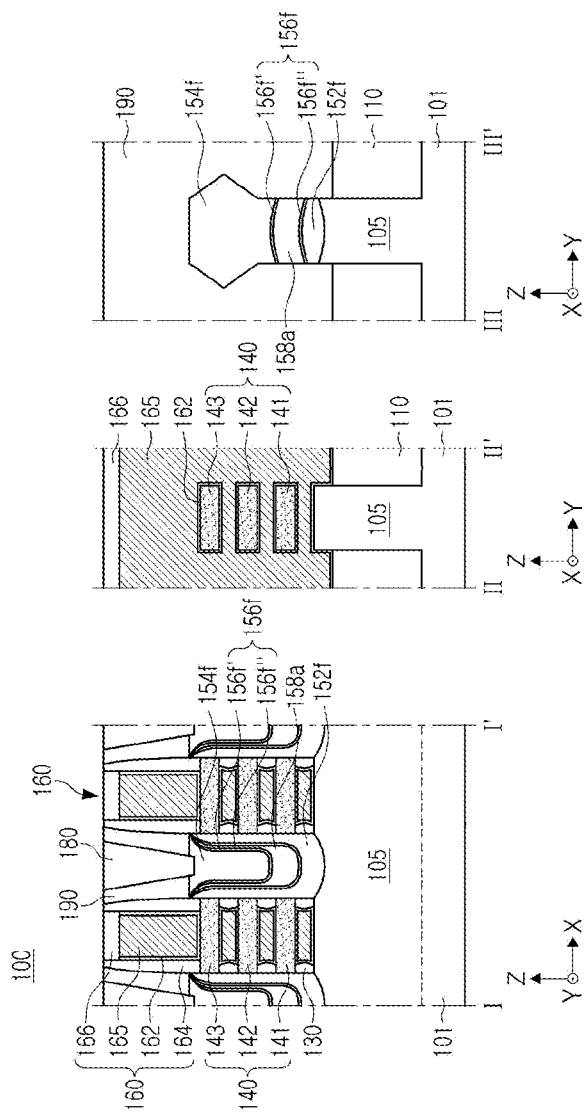
Figure 11:
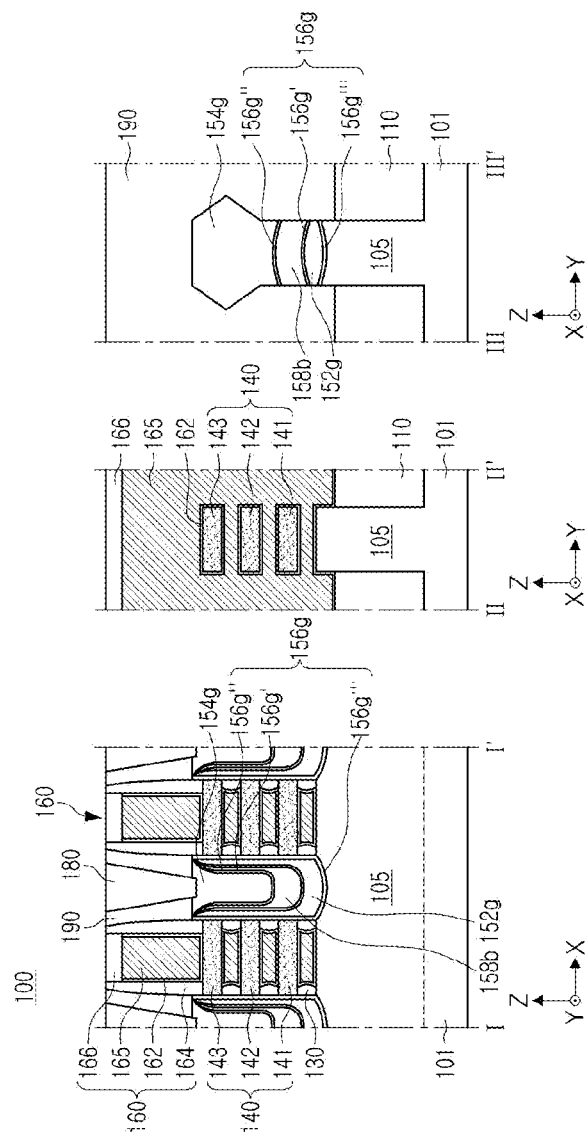

In the example embodiments in FIGS. 9 to 11, the structure in which a third layer 158 is disposed between the first epitaxial layer 152 and the second epitaxial layer 154 in FIGS. 5 to 8 may be provided.

According to an example in FIG. 9, the third layer 158 may be a diffusion barrier for preventing diffusion of impurities. According to an example, the third layer may be SiGeC. Hereinafter, it may be assumed that the third layer 158 is a SiGeC film for primarily preventing diffusion of impurities.

The third layer 158 may be between the first epitaxial layer 152e and the second epitaxial layer 154e, and the barrier layer 156e may be below the third layer 158. Accordingly, diffusion of the impurities doped into the second epitaxial layer 154e may be prevented, thereby improving performance of the semiconductor device. According to an example, the thickness of the barrier layer 156e may be smaller than the thickness of the third layer 158.

According to another example in FIG. 9, the third layer 158 may be an epitaxial layer doped with impurities of a first conductivity type. According to an example, the concentration of the impurities doped into the third layer 158 may be lower than the concentration of the impurities doped into the second epitaxial layer 154e.

According to an example, even when three or more epitaxial layers 152e, 154e, and 158 are formed, by disposing the barrier layer 156 in a region between the third layer 158 and the first epitaxial layer 152e adjacent to the channel region, diffusion of impurities may be prevented.

As for a general semiconductor device, a semiconductor device having a structure in which the third layer 158 includes SiGeC may be used, and when the thickness of the third layer 158 increases, the thickness of the second epitaxial layer 154e which may greatly apply stress to channels may be reduced. Accordingly, the prevention of diffusion may be reduced, and the charge mobility in the PMOS may be reduced, such that properties may degrade.

In the example embodiment, a structure including an oxygen-doped barrier layer 156 which may prevent the diffusion even with a thin thickness may be provided. Accordingly, the thickness of the diffusion barrier layer may be reduced, such that a sufficient thickness of the second epitaxial layer 154e may be secured, and properties in the PMOS may improve.

In the example embodiment in FIG. 10, descriptions overlapping those in the example embodiment in FIG. 9 will not be provided.

According to the example embodiment in FIG. 10, a barrier layer 156f enclosing the third layer 158a may be provided. A first barrier layer 156f" may be disposed below the third layer 158a, and a second barrier layer 156f' may be disposed on the third layer 158a.

According to an example, when the third layer 158a is a diffusion barrier film for preventing diffusion of impurities, the barrier layer 156f may be provided to entirely surround the third layer 158a, such that diffusion of impurities may be further prevented, differently from the other example embodiments.

According to another example, when the third layer 158a is an epitaxial layer doped with impurities of the first conductivity type, the first barrier layer 156f" and the second barrier layer 156f' may be provided in a region between the channel structure 140 and the second epitaxial layer 154f having the highest doping concentration, such that diffusion of impurities may be further prevented.

In the example embodiment in FIG. 11, descriptions overlapping those in the example embodiment in FIG. 10 will not be provided.

According to the example embodiment in FIG. 11, the barrier layer 156g may be provided as three layers. A first barrier layer 156g' may be provided below the third layer 158b, a second barrier layer 156g" may be provided on the third layer 158b, and a third barrier layer 156g''' may be provided below the first epitaxial layer 152g.

The difference from the example embodiment in FIG. 10 may be the configuration in which the third barrier layer 156g''' provided below the first epitaxial layer 152g may be further included.

By further including the third barrier layer 156g''' provided below the first epitaxial layer 152g, the diffusion from the second epitaxial layer 154g to the channel region may be reliably prevented.

Figure 12:
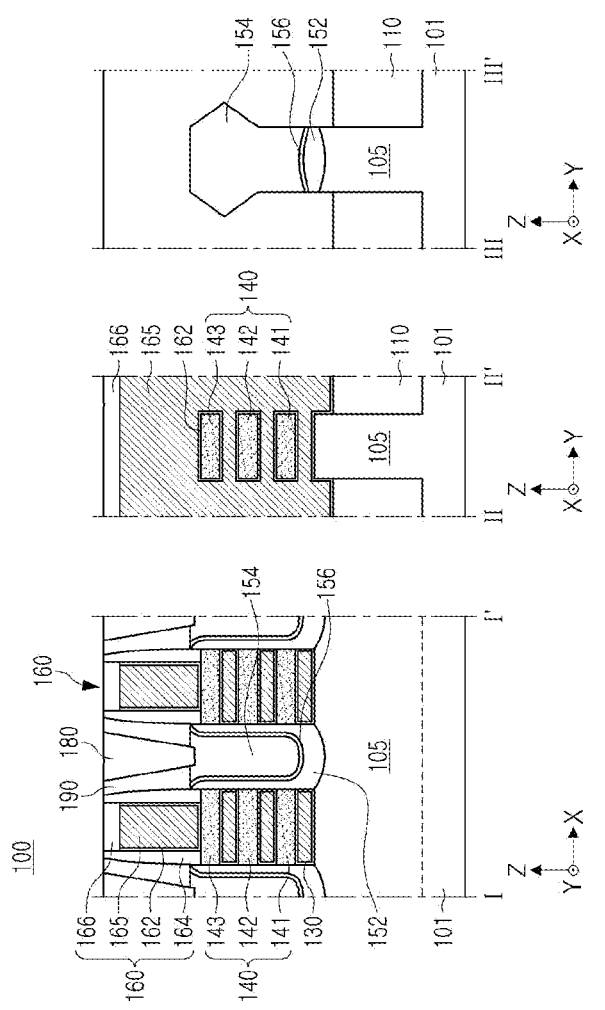

Referring to FIG. 12, the semiconductor device 100 may not include the internal spacer layer 130, differently from the aforementioned example embodiment described with reference to FIGS. 5 to 11. The gate electrode 165 may extend in the X-direction between the first to third channel layers 141, 142, and 143 of the channel structure 140. Accordingly, both side surfaces of the gate electrode 165 in the X-direction may be disposed vertically (i.e., in the Z-direction) in parallel with both side surfaces of the channel structure 140. In the example embodiment in FIGS. 5 to 11, the internal spacer layer 130 may be included, but the semiconductor device in the example embodiment may not include the internal spacer layer 130 in the example embodiments in FIGS. 5 to 11.

FIGS. 13A to 13K are views illustrating processes of a method of manufacturing a semiconductor device 100 in order according to example embodiments, FIGS. 13A to 13K illustrate an example embodiment of a method of manufacturing the semiconductor device 100 in FIGS. 1 and 2 and illustrate cross-sectional surfaces corresponding to FIG. 2.

Figure 13A:
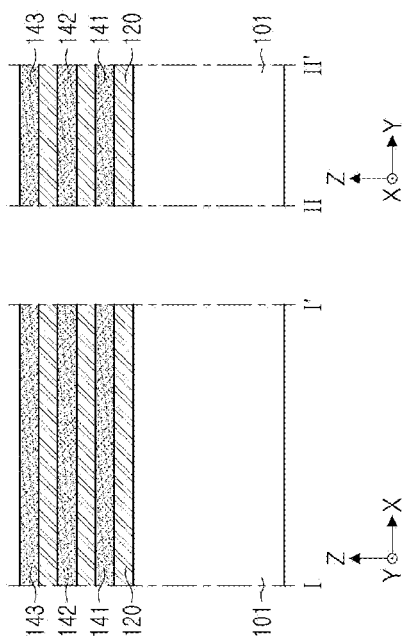
FIGS. 13A to 13K are views illustrating processes of an example method of manufacturing a semiconductor device according to example embodiments of the present disclosure.

Referring to FIG. 13A, sacrificial layers 120 and channel layers 141, 142, and 143 may be alternately stacked on a substrate 101.

The sacrificial layers 120 may be replaced with the gate dielectric layer 162 and the gate electrode 165 as illustrated in FIG. 1 through a subsequent process. The sacrificial layers 120 may be formed of a material having etch selectivity with respect to the channel layers 141, 142, and 143. The channel layers 141, 142, and 143 may include a material different from that of the sacrificial layers 120. The sacrificial layers 120 and the channel layers 141, 142, and 143 may include, for example, a semiconductor material including at least one of silicon (Si), silicon germanium (SiGe), and germanium (Ge), may include different materials, and may or may not include impurities. For example, the sacrificial layers 120 may include silicon germanium (SiGe), and the channel layers 141, 142, and 143 may include silicon (Si).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness in a range of about one Angstrom (1 Å) to 100 nm. The number of the channel layers 141, 142, and 143 alternately stacked with the sacrificial layer 120 may be varied in example embodiments.

Figure 13B:
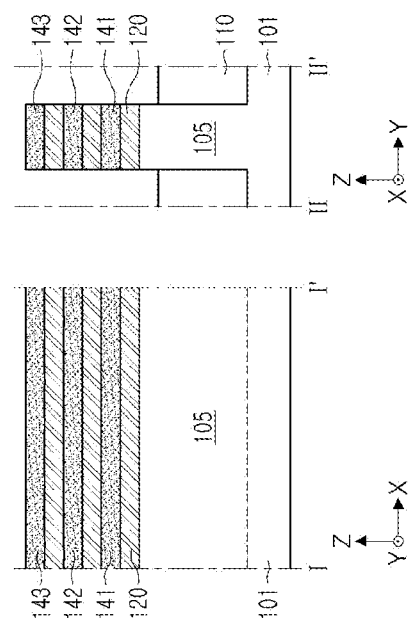

Referring to FIG. 13B, active structures may be formed by partially removing the stack structure of the sacrificial layers 120 and the channel layers 141, 142, and 143 and the substrate 101.

The active structure may include the sacrificial layers 120 and the channel layers 141, 142, and 143 alternately stacked, and may further include an active region 105 formed to be exposed to the upper surface of the substrate 101 by partially removing the substrate 101. The active structures may be formed in a linear shape extending in a first direction, such as, for example, the X-direction, and may be spaced apart from each other in a second direction, such as, for example, the Y-direction.

By filling an insulating material in the region from which a portion of the substrate 101 is removed and recessing the region to protrude the active region 105, device isolation layers 110 may be formed. An upper surface of the device isolation layers 110 may be on a level lower than a level of an upper surface of the active region 105.

Figure 13C:
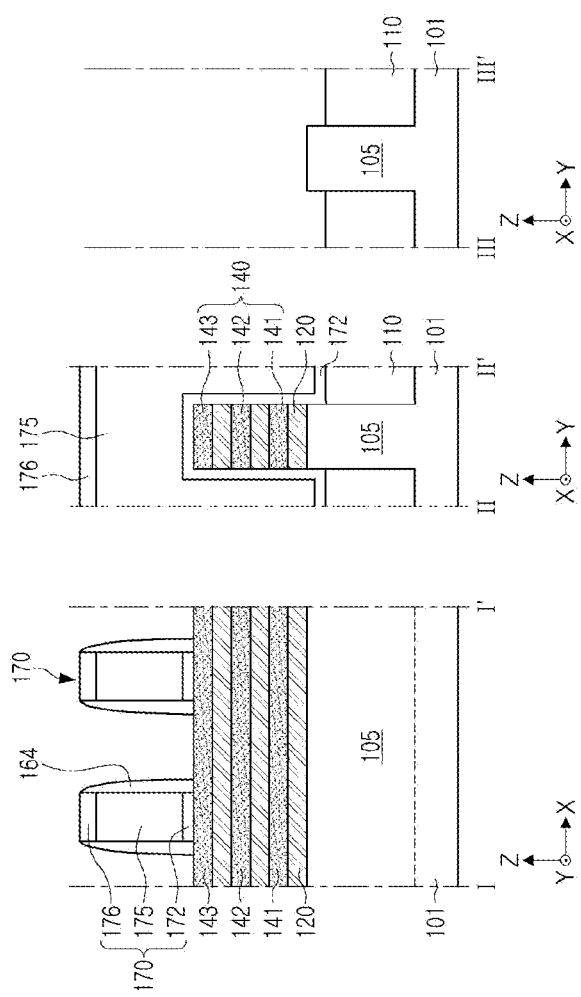

Referring to FIG. 13C, sacrificial gate structures 170 and gate spacer layers 164 may be formed on the active structures.

The sacrificial gate structures 170 may be sacrificial structures formed in a region above the channel structures 140 in which the gate dielectric layer 162 and the gate electrode 165 are disposed through a subsequent process as illustrated in FIG. 2. The sacrificial gate structure 170 may include first and second sacrificial gate layers 172 and 175 and a mask pattern layer 176 stacked in order. The first and second sacrificial gate layers 172 and 175 may be patterned using a mask pattern layer 176. The first and second sacrificial gate layers 172 and 175 may be an insulating layer and a conductive layer, respectively, but example embodiments thereof are not limited thereto, and the first and second sacrificial gate layers 172 and 175 may be integrated as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a linear shape intersecting the active structures and extending in one direction. The sacrificial gate structures 170 may extend, for example, in the Y-direction and may be spaced apart from each other in the X-direction.

Gate spacer layers 164 may be formed on both sidewalls of the sacrificial gate structures 170. The gate spacer layers 164 may be formed by forming a film having a uniform thickness along the upper and side surfaces of the sacrificial gate structures 170 and the active structures and performing anisotropic etching. The gate spacer layers 164 may be formed of a low-k material, and may include, for example, at least one of SiO, SiN, SiCN, SiOC, SiON, and SiOCN.

Figure 13D:
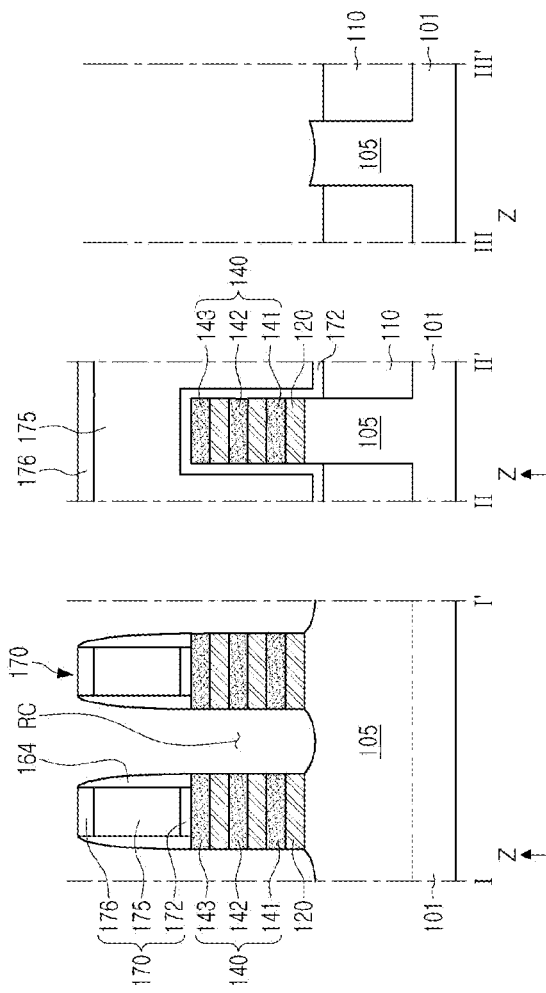

Referring to FIG. 13D, by forming a recess region RC by removing the exposed sacrificial layers 120 and the channel layers 141, 142, and 143 between the sacrificial gate structures 170, channel structures 140 may be formed.

The exposed sacrificial layers 120 and the channel layers 141, 142, and 143 may be removed using the sacrificial gate structures 170 and the gate spacer layers 164 as masks. Accordingly, the channel layers 141, 142, and 143 may have a limited length in the X-direction and may form the channel structure 140. According to another example embodiment, the sacrificial layers 120 and the channel structure 140 may be partially removed from the side surface below the sacrificial gate structures 170, such that both side surfaces in the X-direction may be below the sacrificial gate structures 170 and the gate spacer layers 164.

Figure 13E:
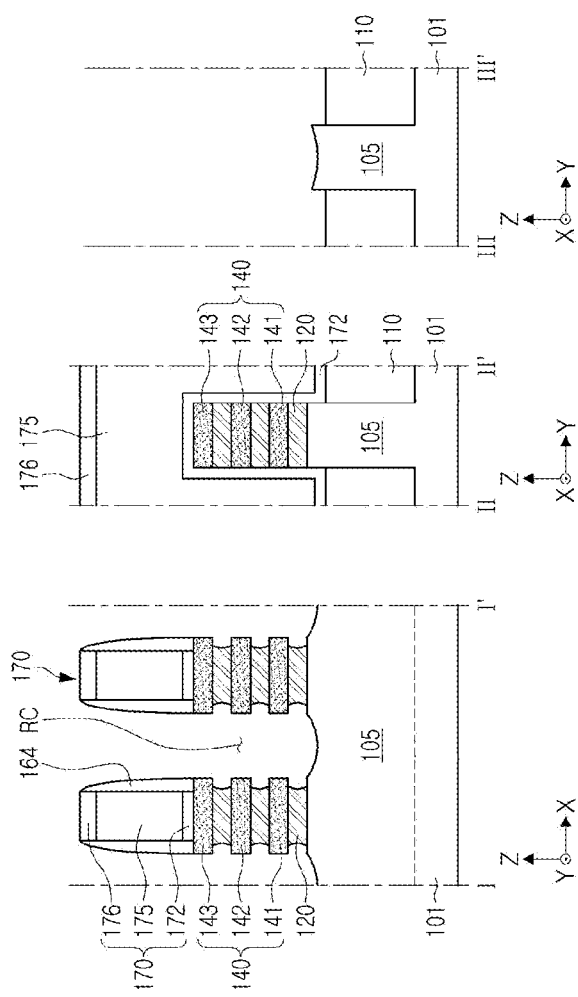

Referring to FIG. 13E, the exposed sacrificial layers 120 may be partially removed from the side surface.

The sacrificial layers 120 may be selectively etched with respect to the channel structures 140 by, for example, a wet etching process, and may be removed by a predetermined depth from the side surface in the X-direction. The sacrificial layers 120 may have inwardly curved side surfaces by etching the side surface as above. However, the shape of the side surfaces of the sacrificial layers 120 is not limited to the illustrated example.

Figure 13F:
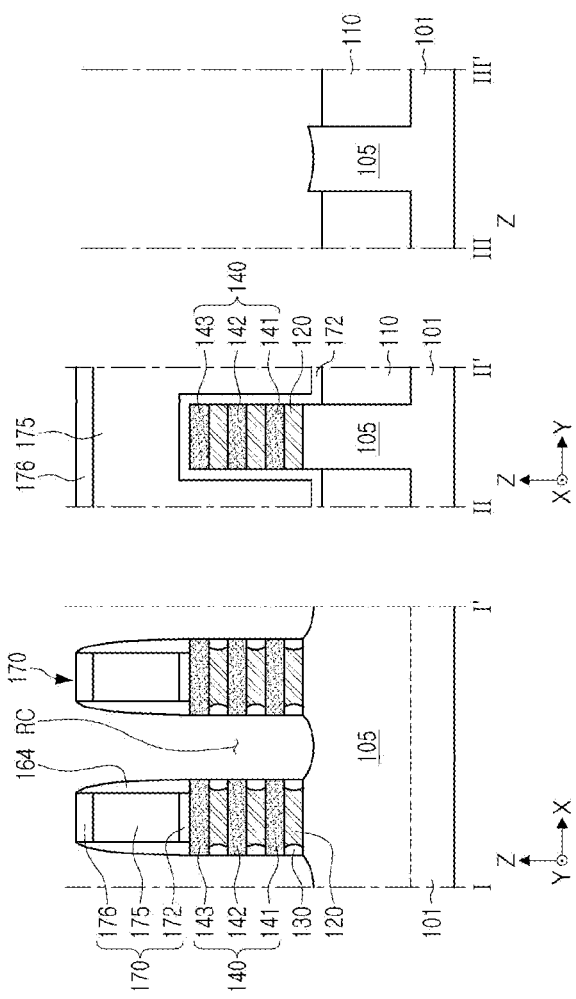

Referring to FIG. 13F, the internal spacer layers 130 may be formed in the region from which the sacrificial layers 120 are removed.

The internal spacer layers 130 may be formed by completely or partially filling an insulating material in a region from which the sacrificial layers 120 are removed and removing the insulating material deposited on the external side of the channel structures 140. The internal spacer layers 130 may be formed of the same material as that of the spacer layers 164, but example embodiments thereof are not limited thereto. For example, the internal spacer layers 130 may include at least one of SiN, SiCN, SiOCN, SiBCN, and SiBN.

Figure 13G:
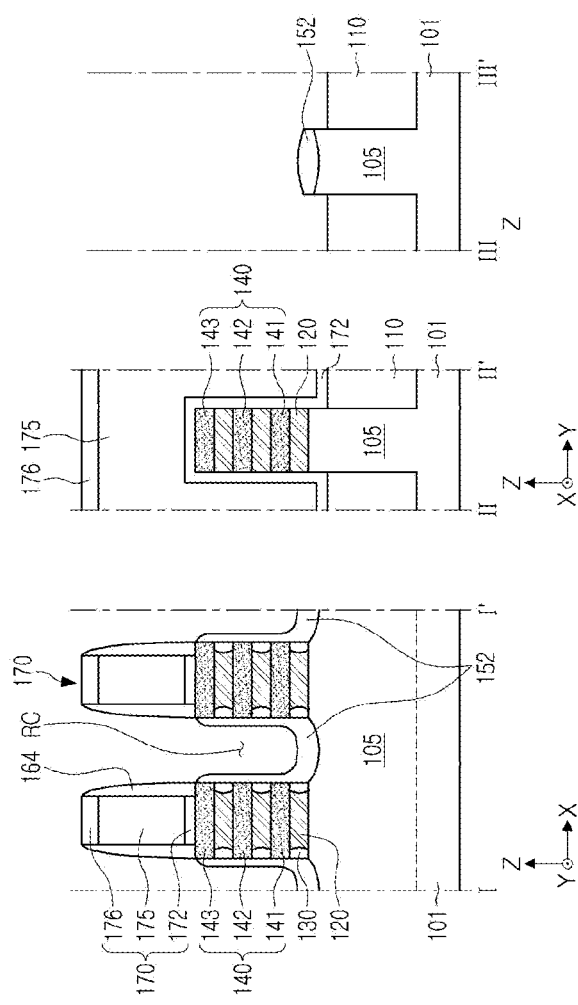

Referring to FIG. 13G, the first epitaxial layer 152 of the source/drain regions may be formed in the recess region RC. The source or drain regions may be formed by a suitable epitaxy technique. The first epitaxial layer 152 may be formed by epitaxial growth and may include impurities by in-situ doping. The first epitaxial layer 152 may be, for example, a SiAs layer or a SiP layer. The first epitaxial layer 152 may be formed on the active region 105 on side surfaces of the first to third channel layers 141, 142, and 143 and on the bottom surface of the recess region RC.

Figure 13H:
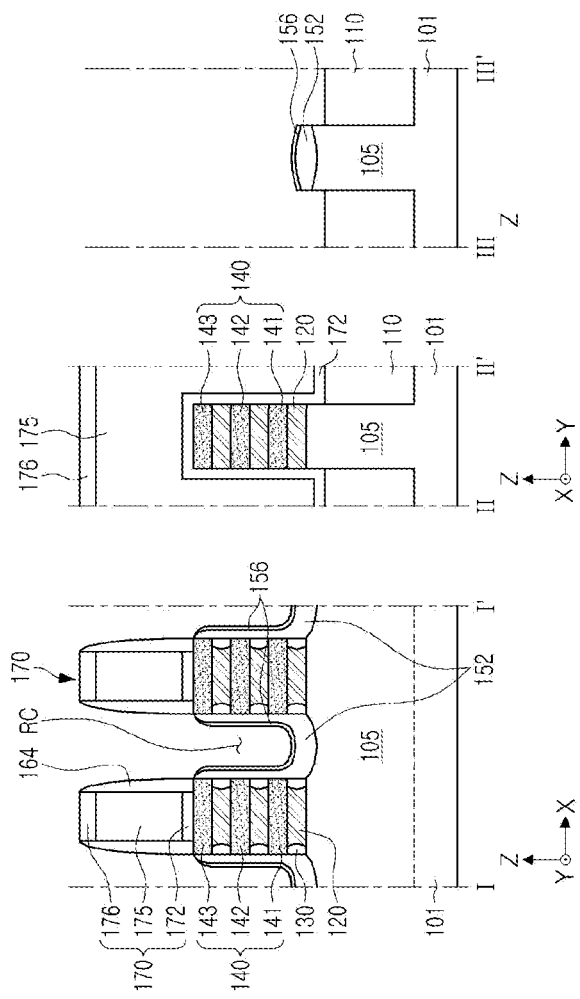

Referring to FIG. 13H, a barrier layer 156 may be formed on the first epitaxial layer 152. According to an example, the barrier layer 156 may be formed by selective epitaxial growth (SEG). According to an example, the barrier layer 156 may be doped with oxygen. When the barrier layer 156 is formed as a single layer, the semiconductor material may be grown and oxygen may be doped through in-situ doping. According to an example, when the barrier layer 156 is formed as a single layer, oxygen may be implanted through an ex-situ ion implantation method. When the barrier layer 156 is formed as a single layer, the thickness of the barrier layer 156 may be formed to be 5 nm or less. Alternatively, when the barrier layer 156 is provided in a superlattice structure, the superlattice structure may be formed by repeating a method of stacking a first material layer and growing a second material layer including oxygen. Even when the barrier layer 156 is provided in the superlattice structure, the total thickness of the barrier layer 156 may be formed to be 5 nm or less. The distance between the second material layers included in the superlattice structure may be 2 nm or less. According to an example, the distance between the second material layers included in the superlattice structure may be 1 nm or more and 1.5 nm or less.

Figure 13I:
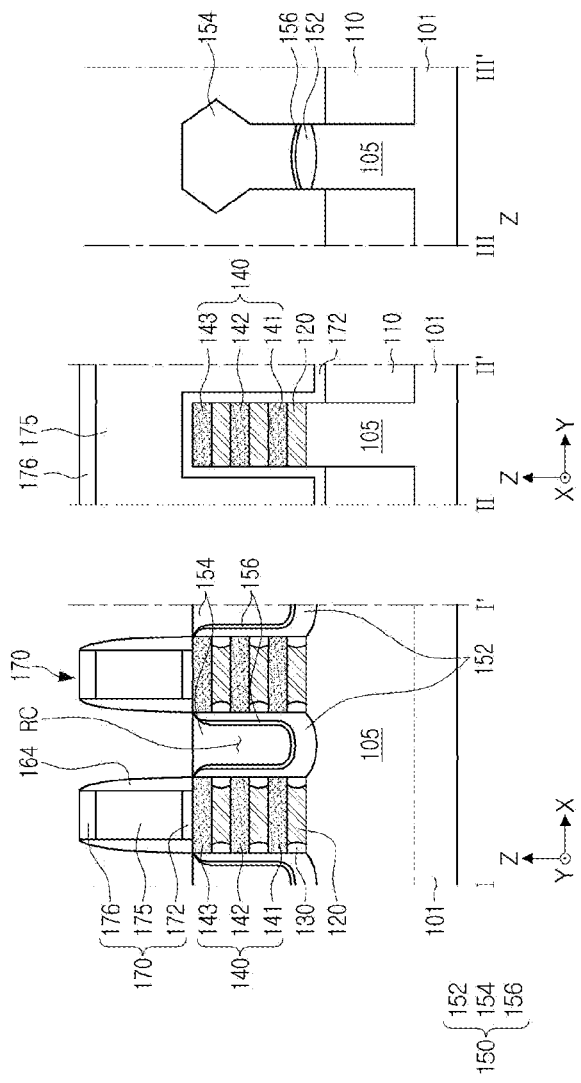

Referring to FIG. 13I, the second epitaxial layer 154 of the source/drain region may be formed to completely or partially fill the recess region RC. The second epitaxial layer 154 may be grown from the first epitaxial layers 152 and the active region 105 using an SEG process, and may be an in-situ doped semiconductor layer, such as, for example, a SiP layer. The concentration of phosphorus (P) in the second epitaxial layer 154 may be higher than the concentration of arsenic (As) or phosphorus (P) in the first epitaxial layers 152. Accordingly, the source/drain region 150 may be formed. The second epitaxial layer 154 may have a shape similar to an ellipse together with the first epitaxial layer 152, and an upper surface thereof may be relatively flat.

In the source/drain region 150, the first and second epitaxial layers 152 and 154 and the barrier layer 156 may be epitaxially grown. Therefore, in the finally formed source/drain region 150, the boundary between the first epitaxial layers 152, the second epitaxial layer 154, and the barrier layer 156 may not be distinct on a micrograph. However, even in this case, since the first epitaxial layers 152, the second epitaxial layer 154, and the barrier layer 156 have different material compositions, the layers may be distinct by analysis such as transmission electron microscopy energy-dispersive x-ray spectroscopy (TEM-EDX).

Figure 13J:
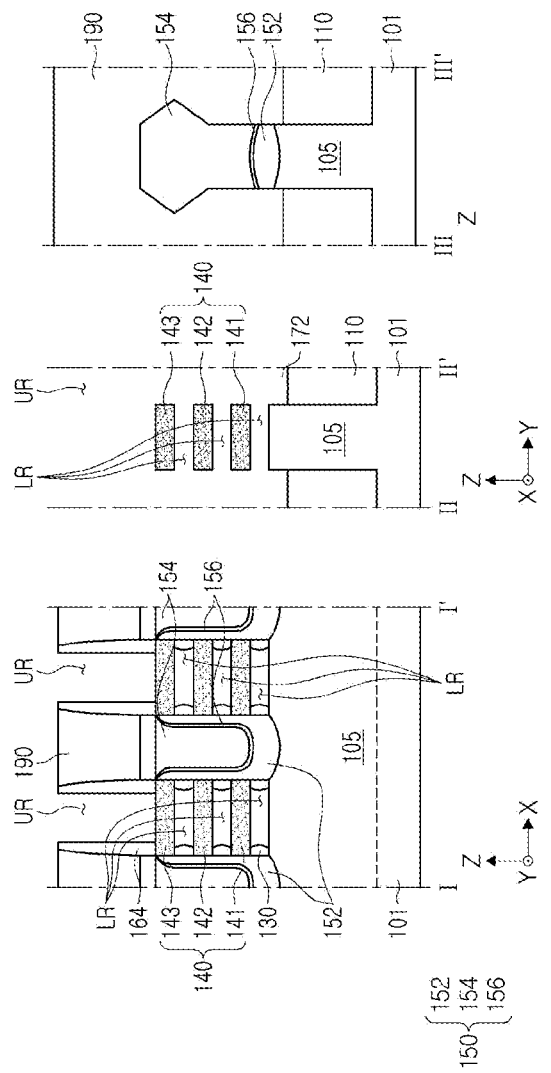

Referring to FIG. 13J, the interlayer insulating layer 190 may be formed, and the sacrificial layers 120 and the sacrificial gate structures 170 may be removed.

The interlayer insulating layer 190 may be formed by forming an insulating layer that at least partially covers the sacrificial gate structures 170 and the source/drain regions 150 and performing a planarization process.

The sacrificial layers 120 and the sacrificial gate structures 170 may be selectively removed with respect to the gate spacer layers 164, the interlayer insulating layer 190, and the channel structures 140. First, upper gap regions UR may be formed by removing the sacrificial gate structures 170, and lower gap regions LR may be formed by removing the sacrificial layers 120 exposed through the upper gap regions UR. For example, when the sacrificial layers 120 include silicon germanium (SiGe) and the channel structures 140 include silicon (Si), the sacrificial layers 120 may be selectively removed by performing a wet etching process using peracetic acid as an etchant. During the removing process, the source/drain regions 150 may be protected by the interlayer insulating layer 190 and the internal spacer layers 130.

Figure 13K:
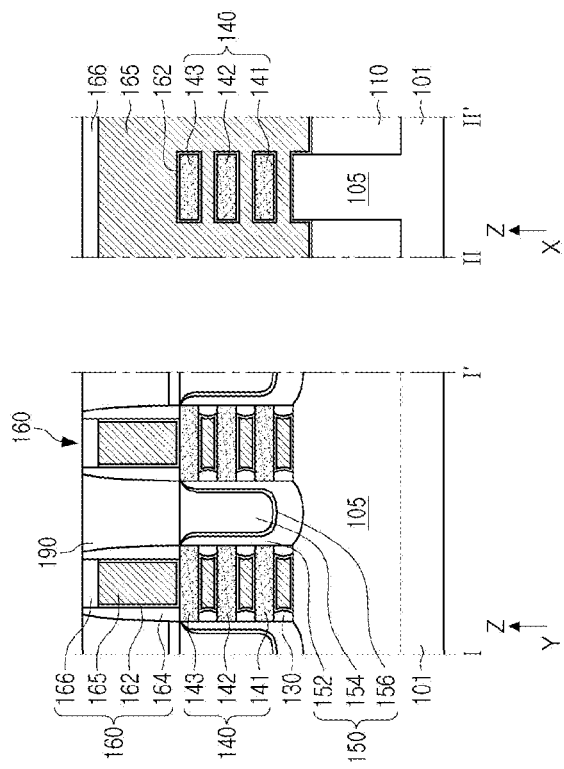

Referring to FIG. 13K, gate structures 160 may be formed in the upper gap regions UR and the lower gap regions LR.

The gate dielectric layers 162 may conform to, and at least partially cover, internal surfaces of the upper gap regions UR and the lower gap regions LR. The gate electrodes 165 may be formed to entirely fill the upper gap regions UR and the lower gap regions LR, and may be removed by predetermined depth from the upper portion of the upper gap regions UR. A gate capping layer 166 may be formed in a region of the upper gap regions UR from which the gate electrodes 165 are removed. Accordingly, the gate structures 160 including the gate dielectric layer 162, the gate electrode 165, the gate spacer layers 164, and the gate capping layer 166 may be formed.

Thereafter, referring back to FIG. 2, the contact plug 180 may be formed.

First, the interlayer insulating layer 190 may be patterned to form a contact hole, and the contact hole may be completely or partially filled with a conductive material, thereby forming a contact plug 180. A lower surface of the contact hole may be recessed into the source/drain regions 150 or may have a curve along the upper surface of the source/drain regions 150. In example embodiments, the shape and arrangement of the contact plug 180 may be varied.

FIG. 14 is a cross-sectional view illustrating a portion of a semiconductor device according to example embodiments, only illustrating main components of the semiconductor device.

Referring to FIG. 14, a semiconductor device may include a substrate 101, an active region 105, an isolation layer 110, source/drain regions 150a, gate structures 160a, contact plugs 180, and an interlayer insulating layer 190. The semiconductor device 100 may include FinFET devices in which the active region 105 is a transistor having a fin structure. The FinFET devices may include transistors around the active region 105 and the gate structures 160a intersecting each other. For example, the transistors may be NMOS transistors or PMOS transistors. Hereinafter, the elements having the same reference numerals as those in FIGS. 1 and 2 are corresponding elements, and a description overlapping the above description will not be provided.

The active region 105 may be defined by the device isolation layer 110 in the substrate 101, and may be disposed to extend in the first direction, such as, for example, the X-direction. The active region 105 may have a structure protruding from the substrate 101. The upper end of the active region 105 may protrude from the upper surface of the device isolation layer 110 by a predetermined height. The active region 105 may be formed as a portion of the substrate 101, or may include an epitaxial layer grown from the substrate 101. However, the active region 105 on the substrate 101 may be partially recessed from both sides of the gate structures 160a, and source/drain regions 150a may be on the recessed active region 105.

The source/drain regions 150a may be on the recess regions in which the active region 105 is recessed on both sides of the gate structures 160a. The recess region may extend in the X-direction between the gate structures 160a, and may have internal sidewalls on both ends taken in the X-direction and a bottom surface between the internal sidewalls. The source/drain regions 150a may be provided as a source region or a drain region of the transistors. As illustrated in FIG. 14, upper surfaces of the source/drain regions 150a may be on a level similar to or higher than a level of the bottom surfaces of the gate structures 160a. However, the relative levels of the source/drain regions 150a and the gate structures 160a may be varied in example embodiments. For example, the source/drain regions 150a may have an elevated source/drain shape in which upper surfaces thereof may be disposed on a level higher than a level of the gate structures 160a, that is, for example, the bottom surfaces of the gate electrodes 165.

A cross-sectional surface of the source/drain regions 150a taken in the Y-direction may have a pentagonal shape, a hexagonal shape, or a shape similar to the above examples. However, in example embodiments, the source/drain regions 150a may have various shapes, such as, for example, one of a polygonal shape, a circular shape, and a rectangular shape. Also, as illustrated in FIG. 14, a cross-sectional surface of the source/drain regions 150a taken in the X-direction may have a relatively flat upper surface, and may have a downwardly curved shape as a portion of a circular shape, an oval shape, or a shape similar to the above examples below the upper surface. The shape described above may be varied in example embodiments depending on the distance between the gate structures 160a adjacent to each other and the height of the active region 105.

The source/drain regions 150a may include first epitaxial layers 152h, a barrier layer 156h, and a second epitaxial layer 154h stacked in order, such as in one example, a sequential order with the first epitaxial layer being provided first, followed by the barrier layer 156h, and then the second epitaxial layer 154h. Both the first epitaxial layers 152h and the second epitaxial layer 154h may include silicon (Si), and may include impurities of different elements and/or concentrations. However, in example embodiments, the number of the epitaxial layers included in the source/drain region 150a may be varied.

According to an example, the impurities doped into the first epitaxial layer 152h and the second epitaxial layer 154h may be impurities of the same conductivity type. For example, the first epitaxial layer 152h may include one of arsenic (As), phosphorus (P), antimony (Sb), boron (B), gallium (Ga), and aluminum (Al), and may be a SiAs layer, a SiP layer, or a SiGeP layer. The first epitaxial layers 152h may be disposed on the recess region. The second epitaxial layer 154h may be a region including impurities in a concentration higher than a concentration of that of the first epitaxial layer 152h. The second epitaxial layer 154h may be a layer epitaxially grown on the first epitaxial layer 152h. The impurities doped in the second epitaxial layer 154h may be the same as or different from those doped in the first epitaxial layer 152h. For example, the second epitaxial layer 154h may be a SiP layer including phosphorus (P). In an example embodiment, the first epitaxial layer 152h may be an SiAs epitaxial layer, and the second epitaxial layer 154h may be an SiP epitaxial layer.

The barrier layer 156h may be provided by epitaxial growth between the first epitaxial layer 152h and the second epitaxial layer 154h. The barrier layer 156h may be doped with oxygen. The concentration of oxygen doped in the barrier layer 156h may satisfy a range of $1 \times 10^{19}$ atoms/cm$^3$ to $1 \times 10^{21}$ atoms/cm$^3$. The barrier layer 156h may have a superlattice structure. According to another example, the barrier layer 156h may be provided as a single layer.

According to an example, the thickness of the barrier layer 156h may be configured to be 5 nm or less. According to an example, the thickness of the barrier layer 156h may be smaller than the thickness of each of the first epitaxial layer 152h and the second epitaxial layer 154h. According to an example, the barrier layer 156h may be one of an O-doped SiP layer, an O-doped SiAs layer, an O-doped SiGe layer, and an O-doped Si layer. In the example embodiment, diffusion of impurities included in the source/drain region 150a may be prevented through the barrier layer 156h in which the semiconductor material is doped with oxygen. According to an example, the barrier layer 156h may be between the first epitaxial layer 152h and the second epitaxial layer 154h, and may prevent diffusion of impurities from the second epitaxial layer 154h having a higher doping concentration into the first epitaxial layer 152h and the channel. In FIG. 14, only the structure in which the barrier layer 156h is between the first epitaxial layer 152h and the second epitaxial layer 154h is illustrated, but the example embodiment in FIGS. 5 to 11 may also be applied to the source/drain regions in FIG. 14.

The gate structures 160a may intersect the active region 105 and may extend in one direction, such as, for example, the Y-direction, on the active region 105. Channel regions of transistors may be formed in the active region 105 intersecting the gate structures 160a. That is, the "channel region" may refer to a region including a depletion region of a transistor, and may refer to a region of the active region 105 which intersects the gate structures 160a and is adjacent to the gate structures 160a. The gate structure 160a may include first and second gate dielectric layers 162 and 163, a gate electrode 165, gate spacer layers 164, and a gate capping layer 166.

The first and second gate dielectric layers 162 and 163 may be between the active region 105 and the gate electrodes 165, and the first gate dielectric layer 162 may be on a lower surface of the second gate dielectric layer 163 that is on the lower surfaces of the gate electrodes 165, and the second gate dielectric layer 163 may at least partially cover the lower surface and both side surfaces of the gate electrodes 165. In example embodiments, one of the first and second gate dielectric layers 162 and 163 may not be provided. The first and second gate dielectric layers 162 and 163 may include oxide, nitride, or a high-k material. The high-k material may refer to a dielectric material having a dielectric constant higher than that of a silicon oxide layer ($SiO_2$). The high dielectric constant material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may include a conductive material, such as, for example, metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The gate electrodes 165 may include multiple layers, that is, two or more layers. Depending on the configuration of the semiconductor device 100, the gate electrode 165 may be separated from each other between at least a portion of transistors adjacent to each other.

Gate spacer layers 164 may be on both sides of the gate electrode 165. The gate spacer layers 164 may insulate the source/drain regions 150 from the gate electrodes 165. The gate spacer layers 164 may have a multilayer structure in example embodiments. The gate spacer layers 164 may be formed of oxide, nitride, or oxynitride, and may be formed of a low-k film, for example.

The gate capping layer 166 may be on the gate electrode 165, and the lower surface and side surfaces may be surrounded by the gate electrode 165 and the gate spacer layers 164, respectively.

The contact plug 180 may penetrate the interlayer insulating layer 190 and may be connected to the source/drain region 150, and may apply an electrical signal to the source/drain region 150. The contact plug 180 may be on the source/drain region 150, and may have a length in the Y-direction greater than that of the source/drain region 150 in example embodiments. The contact plug 180 may have an inclined side of which a lower width may be narrower than an upper width depending on an aspect ratio, but an example embodiment is not limited thereto. The contact plug 180 may be disposed to recess the source/drain region 150a by a predetermined depth. However, in example embodiments, the contact plug 180 may be in contact with an upper surface of the source/drain region 150a without recessing the source/drain region 150a.

FIGS. 15A to 15G are views illustrating processes of a method of manufacturing a semiconductor device in order according to example embodiments. FIGS. 15A to 15G illustrate an example embodiment of a method of manufacturing the semiconductor device in FIG. 14, and illustrate cross-sectional surfaces corresponding to FIG. 14.

Figure 15A:
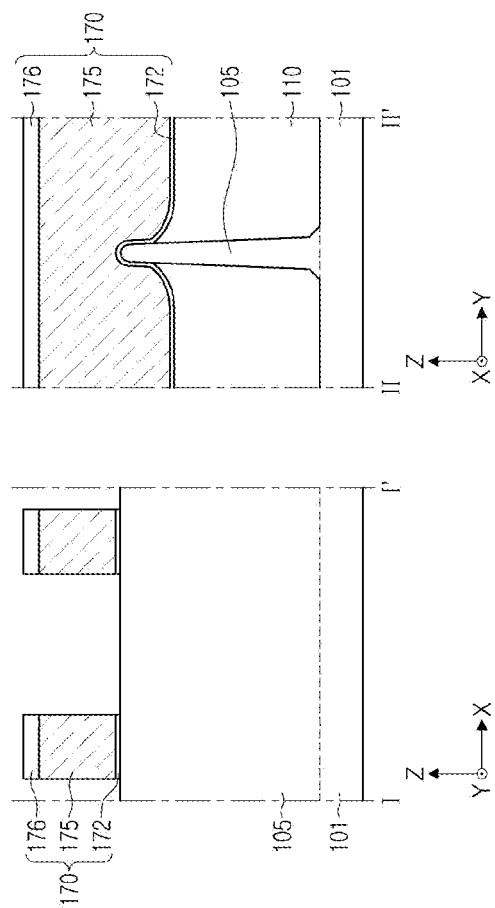

Referring to FIG. 15A, the substrate 101 may be patterned to define the active region 105, the device isolation layer 110 may be formed, and sacrificial gate structures 170 may be formed.

First, the active region 105 may be formed by forming trenches by anisotropically etching the substrate 101 using a mask layer. Since the trench regions have a high aspect ratio, the width thereof may decrease downwardly, and accordingly, the active region 105 may have a shape of which a width may decrease upwardly. The device isolation layer 110 may be formed by at least partially filling the trench regions with an insulating material and planarizing the trench regions along an upper surface of the active region 105.

Thereafter, the sacrificial gate structures 170 may be formed on the active region 105 to have a linear shape intersecting the active region 105 and extending in the Y-direction. The sacrificial gate structures 170 may be formed in a region in which the first and third gate dielectric layers 162 and 163 and the gate electrode 165 are disposed through a subsequent process as illustrated in FIG. 14. The sacrificial gate structure 170 may include first and second sacrificial gate layers 172 and 175 and a mask pattern layer 176. The first and second sacrificial gate layers 172 and 175 may be patterned using a mask pattern layer 176.

The first and second sacrificial gate layers 172 and 175 may be an insulating layer and a conductive layer, respectively, but example embodiments thereof are not limited thereto, and the first and second sacrificial gate layers 172 and 175 may be integrated as a single layer. For example, the first sacrificial gate layer 172 may include silicon oxide, and the second sacrificial gate layer 175 may include polysilicon. The mask pattern layer 176 may include silicon oxide and/or silicon nitride. However, the structure of the sacrificial gate structure 170 may be varied in example embodiments.

Figure 15B:
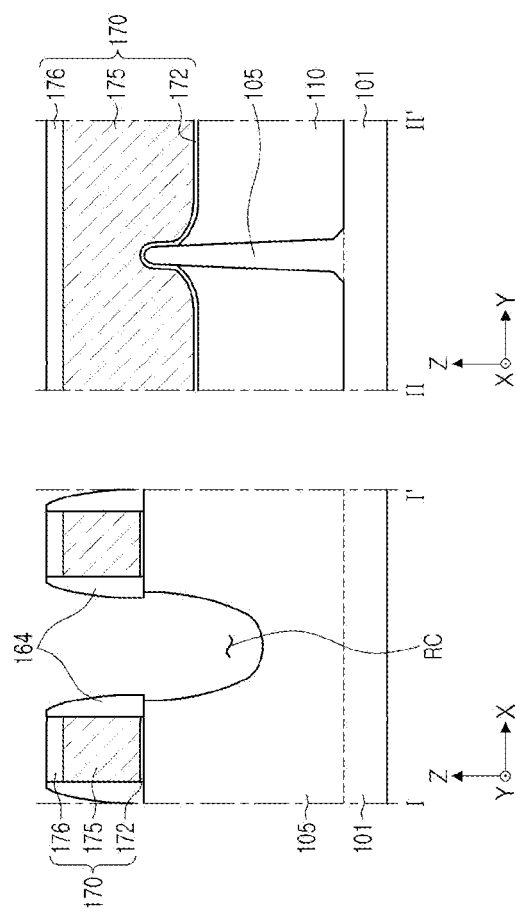

Referring to FIG. 15B, gate spacer layers 164 may be formed on both sidewalls of the sacrificial gate structure 170, and by recessing the active region 105 exposed to a region between the sacrificial gate structures 170, the recess region RC may be formed.

First, gate spacer layers 164 may be formed on a side surface of the sacrificial gate structure 170. The gate spacer layers 164 may be formed of a low-k material, and may include, for example, at least one of SiO, SiN, SiCN, SiOC, SiON, and SiOCN.

Thereafter, the active region 105 may be recessed from the upper surface to a predetermined depth, thereby forming the recess region RC. The recess process may be performed by sequentially applying a dry etching process and a wet etching process, for example. Accordingly, in this process, the active region 105 may be on a lower level on the external side of the sacrificial gate structures 170 than below the sacrificial gate structures 170. In example embodiments, the recess region RC may be configured to extend to a region below the gate spacer layers 164 or the sacrificial gate structures 170. Selectively, after the recess process, a process of curing the surface of the recessed active region 105 through another process may be performed.

Figure 15C:
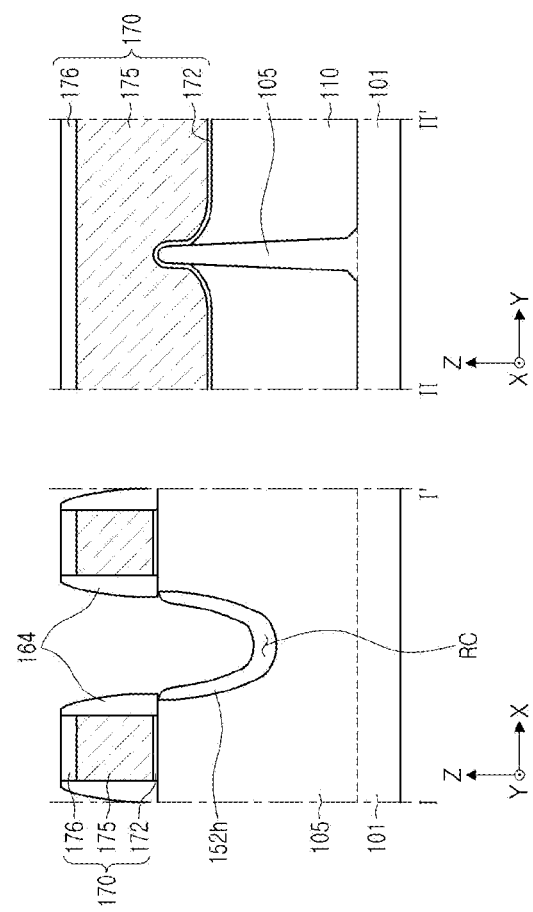

Referring to FIG. 15C, a first epitaxial layer 152h of a source/drain region 150a (see FIGS. 15F and 15G) may be formed. The first epitaxial layer 152h may be formed using, for example, a selective epitaxial growth (SEG) process. The first epitaxial layer 152h may include first impurities by in-situ doping. The first epitaxial layer 152h may be a SiAs or SiP layer. The first epitaxial layer 152h may be formed along an entirety of a lower surface and side surfaces of the recess region RC. The first epitaxial layer 152h may be formed to have a relatively greater thickness on the bottom surface of the recess region RC than on the side surface or may be grown to have a substantially uniform thickness on the side surface and the bottom surface along a crystal plane of the active region 105 exposed through the recess region RC.

Figure 15D:
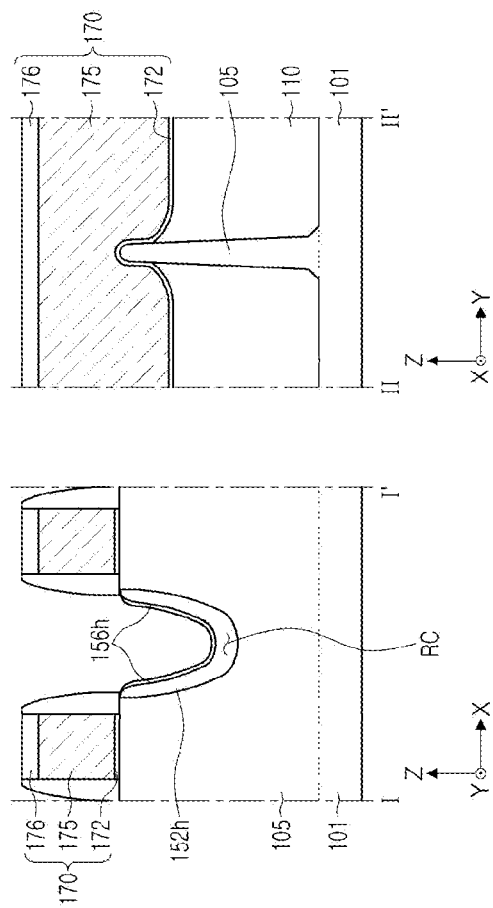

Referring to FIG. 15D, a barrier layer 156h may be formed on the first epitaxial layer 152h. According to an example, the barrier layer 156h may be formed by selective epitaxial growth (SEG). According to an example, the barrier layer 156h may be doped with oxygen. When the barrier layer 156h is formed as a single layer, oxygen may be doped after the semiconductor material is grown. Alternatively, when the barrier layer 156h is provided in a superlattice structure, the superlattice structure may be formed by repeating a method of stacking a first material layer and growing a second material layer including oxygen.

Figure 15E:
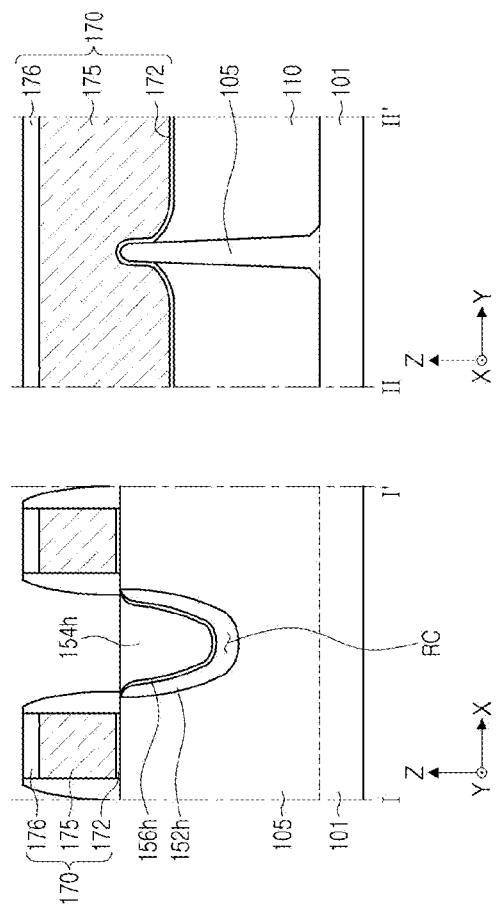

Referring to FIG. 15E, the second epitaxial layer 154h of the source/drain region 150a at least partially filling the recess region RC may be formed. The second epitaxial layer 154h may be formed using an SEG process. The second epitaxial layer 154h may include first impurities by in-situ doping. For example, the second epitaxial layer 154h may be a SiP layer. In this case, the concentration of phosphorus (P) in the second epitaxial layer 154h may be higher than the concentration of arsenic (As) or phosphorus (P) in the first epitaxial layer 152h. Accordingly, the source/drain region 150a including the first epitaxial layer 152h, the barrier layer 156h, and the second epitaxial layer 154h may be finally formed (see FIGS. 15F and 15G).

Figure 15F:
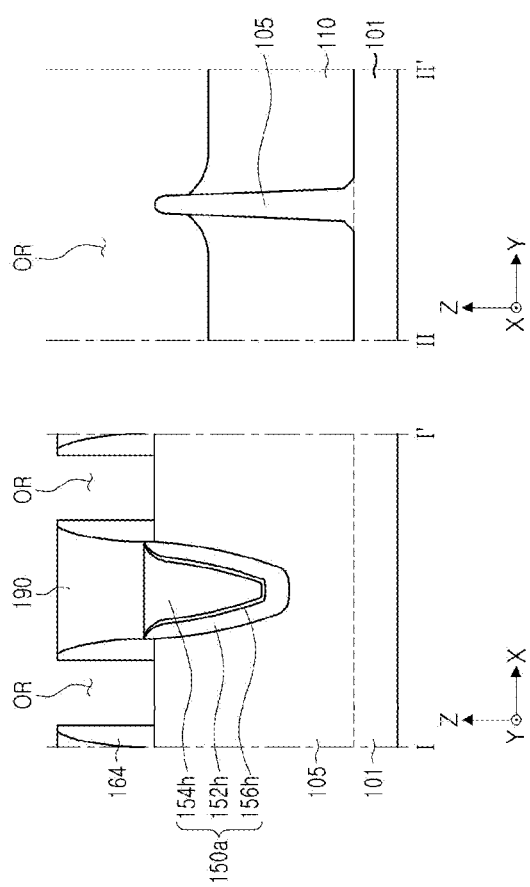

Referring to FIG. 15F, the interlayer insulating layer 190 may be formed on the source/drain regions 150a and the sacrificial gate structure 170 may be removed.

First, the interlayer insulating layer 190 may be formed by depositing an insulating material to at least partially cover the source/drain regions 150a, the sacrificial gate structure 170, and the gate spacer layers 164, and performing a planarization process to expose at least a portion of an upper surface of the second sacrificial gate layer 175 or the mask pattern layer 176. In example embodiments, the mask pattern layer 176 may be removed in the planarization process. The interlayer insulating layer 190 may include, for example, at least one of an oxide, a nitride, and an oxynitride, and may include a low-k material.

Thereafter, the remaining sacrificial gate structure 170 including the first and second sacrificial gate layers 172 and 175 may be selectively removed with respect to the active region 105 and the device isolation layer 110 disposed therebelow, thereby forming openings OR. At least one of a dry etching process and a wet etching process may be used as the process for removing the sacrificial gate structure 170.

Referring to FIG. 15G, by forming the first and second gate dielectric layers 162 and 163, the gate electrode 165, and the gate capping layer 166 in the openings OR, the gate structure 160a may be formed.

The first and second gate dielectric layers 162 and 163 may be formed to substantially conform to, and at least partially cover, sidewalls and lower surfaces of the openings. Each of the first and second gate dielectric layers 162 and 163 may include an oxide, a nitride, or a high-k material. The gate electrode 165 may be formed to fill an internal space of the first and second gate dielectric layers 162 and 163. The gate electrode 165 may include a metal or a semiconductor material.

After the first and second gate dielectric layers 162 and 163 and the gate electrode 165 are formed, a material remaining on the interlayer insulating layer 190 may be removed using a planarization process such as a chemical mechanical polishing (CMP) process.

Thereafter, with reference to FIG. 14, a contact plug 180 may be formed.

First, the interlayer insulating layer 190 may be patterned to form a contact hole, and the contact hole may be at least partially filled with a conductive material to form a contact plug 180. The contact hole may be formed by removing the interlayer insulating layer 190 from both sides of the gate structure 160 using a mask layer such as a photoresist pattern. A lower surface of the contact hole may have a curve along the upper surface of the source/drain regions 150a. When the interlayer insulating layer 190 is removed, upper portions of the source/drain regions 150a may be partially recessed. In example embodiments, the shape and arrangement of the contact plug 180 may be varied.

According to the aforementioned example embodiments, by using a structure in which the source/drain regions have a barrier layer that includes doped oxygen, diffusion of impurities included in the source/drain regions may be prevented, such that a semiconductor device having improved electrical properties may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
   an active region extending on a substrate in a first direction;
   a gate structure intersecting the active region and extending on the substrate in a second direction; and
   a source/drain region on the active region on at least one side of the gate structure,
   wherein the source/drain region comprises a first epitaxial layer and a second epitaxial layer stacked on the active region; and
   an oxygen-doped barrier layer adjacent to at least one of the first epitaxial layer and the second epitaxial layer.

2. The semiconductor device of claim 1, wherein the first epitaxial layer is stacked on the active region before the second epitaxial layer, and the oxygen-doped barrier layer is between the first epitaxial layer and the second epitaxial layer.

3. The semiconductor device of claim 1, wherein the oxygen-doped barrier layer is below the first epitaxial layer in a direction toward a top surface of the substrate.

4. The semiconductor device of claim 1, wherein the oxygen-doped barrier layer entirely surrounds the first epitaxial layer.

5. The semiconductor device of claim 1, further comprising:
a plurality of channel layers spaced apart from each other on the active region,
wherein the gate structure intersects with the plurality of channel layers, extends in the second direction on the substrate, and surrounds one or more of the plurality of channel layers,
wherein the source/drain region contacts at least a portion of one or more of the plurality of channel layers, and
wherein the semiconductor device further comprises internal spacer layers on both sides of the gate structure in the first direction on a lower surface of each of the plurality of channel layers, wherein the lower surface is a surface of each of the plurality of channel layers that is closest to a top surface of the substrate.

6. A semiconductor device, comprising:
an active region extending on a substrate in a first direction;
a gate structure intersecting the active region and extending on the substrate in a second direction; and
a source/drain region on the active region on at least one side of the gate structure,
wherein the source/drain region includes:
a first epitaxial layer on the active region, the first epitaxial layer comprising impurities of a first conductivity type in a first concentration;
a second epitaxial layer on the first epitaxial layer, the second epitaxial layer comprising impurities of the first conductivity type in a second concentration; and
a first barrier layer between the first epitaxial layer and the second epitaxial layer, the first barrier layer comprising doped oxygen.

7. The semiconductor device of claim 6, wherein a concentration of oxygen doped in the first barrier layer is in a range of about $1\times10^{19}$ atoms/cm$^3$ to about $1\times10^{21}$ atoms/cm$^3$.

8. The semiconductor device of claim 6, wherein the first barrier layer has a superlattice structure.

9. The semiconductor device of claim 6,
wherein the first barrier layer comprises a first material layer and a second material layer alternately stacked,
wherein the first material layer comprises a material undoped with impurities of the first conductivity type, and
wherein the second material layer comprises a material including oxygen.

10. The semiconductor device of claim 6,
wherein the first barrier layer comprises a first material layer and a second material layer alternately stacked,
wherein the first material layer comprises a material doped with impurities of the first conductivity type in a concentration lower than the second concentration of the second epitaxial layer, and
wherein the second material layer comprises a material including oxygen.

11. The semiconductor device of claim 6, wherein a thickness of the first barrier layer is smaller than a thickness of each of the first epitaxial layer and the second epitaxial layer, and is in a range of about 0.1 nanometers (nm) to about 5 nm.

12. The semiconductor device of claim 6, wherein the second concentration is higher than the first concentration.

13. The semiconductor device of claim 6, further comprising a third layer between the first barrier layer and the second epitaxial layer, wherein the third layer is a diffusion barrier configured to prevent diffusion of impurities, and wherein the impurities of the first conductivity type comprise at least one of phosphorus (P), arsenic (As), antimony (Sb), boron (B), gallium (Ga), and aluminum (Al).

14. The semiconductor device of claim 6, wherein the first barrier layer is at least one of O-doped SiP, O-doped SiAs, O-doped SiGe, and O-doped Si.

15. The semiconductor device of claim 6,
wherein the active region has a recess region recessed from an upper surface of the active region on at least one side of the gate structure, and
wherein the source/drain region is within the recess region.

16. The semiconductor device of claim 15, wherein the source/drain region further comprises a second barrier layer between the first epitaxial layer and the recess region.

17. The semiconductor device of claim 16, wherein the second barrier layer has a superlattice structure.

18. The semiconductor device of claim 17,
wherein the second barrier layer comprises a first material layer and a second material layer alternately stacked,
wherein the first material layer comprises a material undoped with impurities of the first conductivity type or a material doped with impurities of the first conductivity type in a concentration lower than the second concentration of the second epitaxial layer, and
wherein the second material layer comprises a material including oxygen.

19. A semiconductor device, comprising:
an active region extending on a substrate in a first direction;
a gate structure intersecting the active region and extending on the substrate in a second direction; and
a source/drain region on the active region on at least one side of the gate structure,
wherein the source/drain region comprises at least two or more epitaxial layers on the active region, wherein at least one of the two or more epitaxial layers is doped with impurities of a different concentration than a concentration of at least one other epitaxial layer of the two or more epitaxial layers, and
wherein at least one of the epitaxial layers is provided in a superlattice structure, the superlattice structure comprising oxygen.

20. The semiconductor device of claim 19, wherein the superlattice structure comprises different material layers stacked alternately, and a distance between two or more of the material layers is about one nanometer (1 nm) to about 1.5 nm.

* * * * *